US012787551B2

(12) United States Patent
Liu et al.

(10) Patent No.: US 12,787,551 B2

(45) Date of Patent: Nov. 3, 2026

(54) DISPLAY SUBSTRATE, MANUFACTURING METHOD THEREOF AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Sa Liu, Beijing (CN); Yongyi Fu, Beijing (CN); Hexiong Li, Beijing (CN); Yong Zhou, Beijing (CN); Feng Bai, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 618 days.

(21) Appl. No.: 18/028,265

(22) PCT Filed: Apr. 24, 2022

(86) PCT No.: PCT/CN2022/088755

§ 371 (c)(1),
(2) Date: Mar. 24, 2023

(87) PCT Pub. No.: WO2023/205944

PCT Pub. Date: Nov. 2, 2023

(65) Prior Publication Data

US 2024/0306428 A1 Sep. 12, 2024

(51) Int. Cl.

*H10K 59/122* (2023.01)
*H10K 59/12* (2023.01)

(52) U.S. Cl.

CPC ....... *H10K 59/122* (2023.02); *H10K 59/1201* (2023.02)

(58) Field of Classification Search

CPC ..... H10K 59/122; H10K 59/173; H10K 59/12
See application file for complete search history.

(56) References Cited

U.S. PATENT DOCUMENTS

2014/0217372 A1 8/2014 Shim et al.
2015/0194629 A1 7/2015 Liu et al.
(Continued)

FOREIGN PATENT DOCUMENTS

CN 103413819 A 11/2013
CN 103779470 A 5/2014
(Continued)

OTHER PUBLICATIONS

Jun. 26, 2026—(CN) First Office Action Appn 202280000862.7 with English translation.

*Primary Examiner* — Christine S. Kim
*Assistant Examiner* — Andrew Victor Prostor
(74) *Attorney, Agent, or Firm* — Banner & Witcoff, Ltd.

(57) ABSTRACT

A display substrate, a manufacturing method thereof, and a display device are provided. The display substrate includes sub-pixels, at least part of the sub-pixels include a light emitting element, the light emitting element includes a light emitting functional layer, and a first electrode and a second electrode, the first electrode is located between the light emitting functional layer and the base substrate, and the light emitting functional layer includes film layers; the display substrate further includes a first defining structure located between at least two adjacent sub-pixels, the first defining structure includes an end portion located between the light emitting functional layer and the first electrode, and the first electrode overlaps with the end portion in the direction perpendicular to the base substrate; at least one of the film layers in at least one sub-pixel is disconnected at the end portion of the first defining structure.

17 Claims, 7 Drawing Sheets

(56) References Cited

U.S. PATENT DOCUMENTS

| | | | | |
|---|---|---|---|---|
| 2015/0357388 | A1 | 12/2015 | Pang | |
| 2016/0247862 | A1 | 8/2016 | Song et al. | |
| 2017/0309693 | A1 | 10/2017 | Pang | |
| 2020/0212371 | A1 | 7/2020 | Hou | |
| 2020/0251541 | A1* | 8/2020 | Kim | H10K 71/00 |
| 2020/0312930 | A1* | 10/2020 | Choi | H10K 50/19 |
| 2021/0057504 | A1 | 2/2021 | Ko et al. | |
| 2021/0202624 | A1 | 7/2021 | Gong et al. | |
| 2021/0359042 | A1 | 11/2021 | Hou | |
| 2021/0399256 | A1 | 12/2021 | Hou | |

FOREIGN PATENT DOCUMENTS

| | | | |
|---|---|---|---|
| CN | 103972261 | A | 8/2014 |
| CN | 104167430 | A | 11/2014 |
| CN | 105280676 | A | 1/2016 |
| CN | 106384744 | A | 2/2017 |
| CN | 108899349 | A | 11/2018 |
| CN | 109192886 | A | 1/2019 |
| CN | 109509782 | A | 3/2019 |
| CN | 110137225 | A | 8/2019 |
| CN | 110164907 | A | 8/2019 |
| CN | 110890406 | A | 3/2020 |
| CN | 112072001 | A | 12/2020 |
| CN | 112397555 | A | 2/2021 |
| CN | 113284931 | A | 8/2021 |
| CN | 113327968 | A | 8/2021 |
| CN | 113678258 | A | 11/2021 |
| KR | 20150033345 | A | 4/2015 |
| KR | 1020210083715 | A | 7/2021 |
| WO | 2012081550 | A1 | 6/2012 |

* cited by examiner

DISPLAY SUBSTRATE, MANUFACTURING METHOD THEREOF AND DISPLAY DEVICE

The application is a U.S. National Phase Entry of International Application No. PCT/CN2022/088755 filed on Apr. 24, 2022, designating the United States of America. The present application claims priority to and the benefit of the above-identified application and the above-identified application is incorporated by reference herein in its entirety.

TECHNICAL FIELD

At least one embodiment of the present disclosure relates to a display substrate, a manufacturing method thereof and a display device.

BACKGROUND

With the rapid development of organic light emitting diode (AMOLED) display technology, the display screen adopting this display technology requires higher and higher display quality and resolution. At present, by reducing the pixel spacing, the number of pixels per unit area (PPI) can be increased, thus improving the resolution. However, the decrease of pixel spacing will easily lead to serious lateral leakage between pixels, thus causing color mixing problems and reducing the display quality of the screen.

SUMMARY

Embodiments of the present disclosure provides a display substrate, a manufacturing method thereof and a display device.

At least one embodiment of the present disclosure provides a display substrate, which includes a display region. The display substrate includes a base substrate and a plurality of sub-pixels located on the base substrate, at least part of the sub-pixels located in the display region include a light emitting element, the light emitting element includes a light emitting functional layer, and a first electrode and a second electrode which are located at both sides of the light emitting functional layer along a direction perpendicular to the base substrate, the first electrode is located between the light emitting functional layer and the base substrate, and the light emitting functional layer includes a plurality of film layers. The display substrate further includes at least one first defining structure located between at least two adjacent sub-pixels, the at least one first defining structure includes an end portion located between the light emitting functional layer and the first electrode, and the first electrode overlaps with the end portion in the direction perpendicular to the base substrate; at least one of the plurality of film layers in at least one sub-pixel is disconnected at the end portion of the first defining structure.

For example, according to an embodiment of the present disclosure, the display substrate further includes a pixel defining pattern, located at a side of the first electrode away from the base substrate, the pixel defining pattern includes a plurality of openings, one sub-pixel corresponds to at least one opening, at least part of the light emitting element of the sub-pixel is located in the opening corresponding to the sub-pixel, and at least part of the first electrode overlaps with the opening. The pixel defining pattern includes a second defining structure surrounding the opening, and the second defining structure covers at least part of the first defining structure.

For example, according to an embodiment of the present disclosure, the opening corresponding to the at least one sub-pixel exposes at least part of the end portion of the first defining structure, so that at least one of the plurality of film layers is disconnected at the end portion.

For example, according to an embodiment of the present disclosure, an orthographic projection of the second defining structure on the base substrate completely falls within an orthographic projection of the first defining structure on the base substrate.

For example, according to an embodiment of the present disclosure, the end portion includes a partition part and a buffer part, and the buffer part is located at a side of the partition part close to the base substrate; the buffer part protrudes relative to an edge of the partition part and extends to a center of the sub-pixel in which the light emitting functional layer is disconnected by the end portion.

For example, according to an embodiment of the present disclosure, in the at least one sub-pixel, the second electrode is continuously arranged at the end portion.

For example, according to an embodiment of the present disclosure, a side surface of the end portion includes an inclined surface, and an end of the inclined surface away from the base substrate is inclined to a center of the sub-pixel in which the light emitting functional layer is disconnected by the end portion; or, an included angle between the side surface of the end portion and the base substrate is in a range of 10-90 degrees.

For example, according to an embodiment of the present disclosure, the plurality of film layers include a light emitting layer and at least one common layer, and the at least one common layer is a film layer shared by at least two sub-pixels; the at least one common layer is disconnected at the end portion.

For example, according to an embodiment of the present disclosure, only some of the plurality of film layers are disconnected at the end portion.

For example, according to an embodiment of the present disclosure, the first defining structure surrounds and covers at least part of one circle of an edge of the first electrode in the at least one sub-pixel.

For example, according to an embodiment of the present disclosure, the first defining structure includes a plurality of first defining structures, two first defining structures are arranged between centers of two adjacent sub-pixels, and a gap is arranged between the two first defining structures.

For example, according to an embodiment of the present disclosure, the at least one of the plurality of film layers in the light emitting functional layer of the at least one sub-pixel is continuously arranged at a partial position at an edge of the opening corresponding to the at least one sub-pixel.

For example, according to an embodiment of the present disclosure, the first defining structure includes a ring-shaped first defining structure surrounding the first electrode of the at least one sub-pixel, the opening corresponding to the at least one sub-pixel only exposes a part of the ring-shaped first defining structure, so that the plurality of film layers are continuously arranged at a position of the ring-shaped first defining structure not exposed by the opening.

For example, according to an embodiment of the present disclosure, the plurality of sub-pixels are arrayed along a first direction and a second direction, a distance between adjacent edges of light emitting regions of two adjacent sub-pixels arranged along the first direction is a first distance, a distance between adjacent edges of light emitting regions of two adjacent sub-pixels arranged along the second direction is a second distance, the first direction is intersected with the second direction, a distance between adjacent edges of light emitting regions of two adjacent sub-pixels arranged along a third direction intersected with both the first direction and the second direction is a third distance, and both the first distance and the second distance are less than the third distance; the at least one of the plurality of film layers in the light emitting functional layer of at least one of the two adjacent sub-pixels arranged along the third direction is continuously arranged at edge positions, which are close to each other, of light emitting regions of the adjacent two sub-pixels.

For example, according to an embodiment of the present disclosure, in a direction perpendicular to the base substrate, a thickness of the partition part is greater than a thickness of the buffer part; a size of the buffer part between two adjacent sub-pixels along a direction parallel to a central connecting line of the two adjacent sub-pixels is not greater than 300 nm.

For example, according to an embodiment of the present disclosure, a material of the first defining structure includes an inorganic nonmetallic material.

For example, according to an embodiment of the present disclosure, a material of the first electrode at least includes a crystalline structure.

For example, according to an embodiment of the present disclosure, the first electrode includes a plurality of electrode layers, and at least an electrode layer closest to the light emitting functional layer in the plurality of electrode layers includes the crystalline structure.

At least one embodiment of the present disclosure provides a display device, including the display substrate as mentioned in any embodiment.

At least one embodiment of the present disclosure provides a manufacturing method of a display substrate, which includes: forming a plurality of sub-pixels on a base substrate, wherein the forming the plurality of sub-pixels includes sequentially forming a first electrode, a light emitting functional layer and a second electrode which are arranged in a stacked manner in a direction perpendicular to the base substrate, and the light emitting functional layer includes a plurality of film layers; and after forming the first electrode and before forming the light emitting functional layer, the manufacturing method further including forming a first defining structure material layer on the first electrode and patterning the first defining structure material layer to form a first defining structure, wherein the first defining structure includes an end portion located between the light emitting functional layer and the first electrode. A portion of the light emitting functional layer is formed on the end portion of the first defining structure, and at least one of the plurality of film layers in at least one sub-pixel is disconnected at the end portion of the first defining structure.

For example, according to an embodiment of the present disclosure, the forming the first defining structure material layer on the first electrode and patterning the first defining structure material layer includes: depositing the first defining structure material layer on the first electrode, wherein in a process of depositing the first defining structure material layer, a deposition rate gradually slows down so that a density of a part of the first defining structure material layer away from the base substrate is higher than a density of a part of the first defining structure material layer close to the base substrate; and etching the first defining structure material layer, wherein an etching rate at a position with a relatively high density in the first defining structure material layer is relatively slow, so that a side surface of the end portion being formed includes an inclined surface, and an end of the inclined surface away from the base substrate is inclined to a center of the sub-pixel in which the light emitting functional layer is disconnected by the end portion.

For example, according to an embodiment of the present disclosure, before patterning the first defining structural material layer, the manufacturing method further includes forming a pixel defining pattern by patterning on the first defining structural material layer, wherein the pixel defining pattern includes a plurality of openings, and one sub-pixel corresponds to at least one opening; forming the first defining structure by patterning includes patterning the first defining structure material layer with the pixel defining pattern as a mask.

For example, according to an embodiment of the present disclosure, photoresist is used as a mask to pattern the first defining structure material layer; after forming the first defining structure and before forming the light emitting functional layer, the manufacturing method further includes forming a pixel defining pattern by patterning on the first defining structure, wherein the pixel defining pattern includes a plurality of openings, and one sub-pixel corresponds to at least one opening.

BRIEF DESCRIPTION OF DRAWINGS

In order to clearly illustrate the technical solution of the embodiments of the invention, the drawings of the embodiments will be briefly described in the following; it is obvious that the described drawings are only related to some embodiments of the present disclosure and thus are not limitative of the present disclosure.

DETAILED DESCRIPTION

Figure 1:
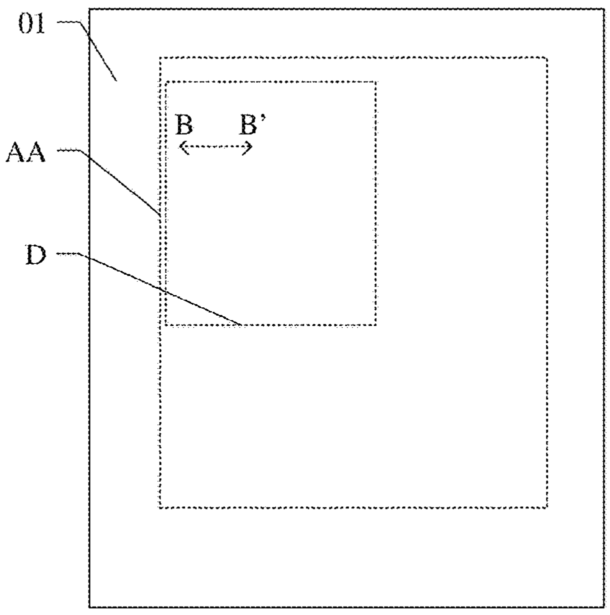
FIG. 1 is a planar view of a display substrate provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

In the embodiment of the present disclosure, the features, "perpendicular to," etc., include the features "perpendicular to," etc., in the strict sense, as well as the cases containing certain errors, such as "approximately perpendicular to," etc. Considering the measurement and the errors related to the measurement of a specific quantity (e.g., the limitation of the measurement system), they are within an acceptable deviation range for the specific quantity determined by those skilled in the art. For example, the term "approximately" can mean within one or more standard deviations, or within 10% or 5% deviation of the stated value. When the quantity of a component is not specified in the following description of the embodiments of the present disclosure, it means that the number of the component can be one or more, or can be understood as at least one. The phrase "at least one" means one or more, and the phrase "plurality of" means at least two.

In research, the inventors of the present application have noticed that: the light emitting functional layer includes a plurality of film layers which are stacked, the plurality of film layers include common layers shared by at least two sub-pixels, at least one film layer in the common layers has high conductivity, the at least one film layer having high conductivity in the common layers can include a hole injection layer and a hole transport layer, and for example, the materials of the hole injection layer and the hole transport layer can include inorganic materials. At least one common layer with high conductivity arranged between two adjacent sub-pixels is easy to cause lateral leakage between the two adjacent sub-pixels, resulting in crosstalk.

At least one embodiment of the present disclosure provides a display substrate, a manufacturing method thereof, and a display device. The display substrate includes a display region; the display substrate includes a base substrate and a plurality of sub-pixels located on the base substrate, at least part of the sub-pixels located in the display region include a light emitting element, the light emitting element includes a light emitting functional layer, and a first electrode and a second electrode which are located at both sides of the light emitting functional layer along a direction perpendicular to the base substrate, the first electrode is located between the light emitting functional layer and the base substrate, and the light emitting functional layer includes a plurality of film layers; the display substrate further includes at least one first defining structure located between at least two adjacent sub-pixels, the first defining structure includes an end portion located between the light emitting functional layer and the first electrode, and the first electrode overlaps with the end portion in the direction perpendicular to the base substrate; at least one of the plurality of film layers in at least one sub-pixel is disconnected at the end portion of the first defining structure. In the display substrate provided by the embodiment of the present disclosure, the first defining structure is set to partition at least some of the film layers in the light emitting functional layer, which is helpful to reduce the probability of the occurrence of lateral leakage current between pixels, and further to improve the display quality of the display substrate when it is used for display.

The display substrate, the manufacturing method thereof and the display device provided by the embodiments of the present disclosure are described below with reference to the accompanying drawings.

Figure 2:
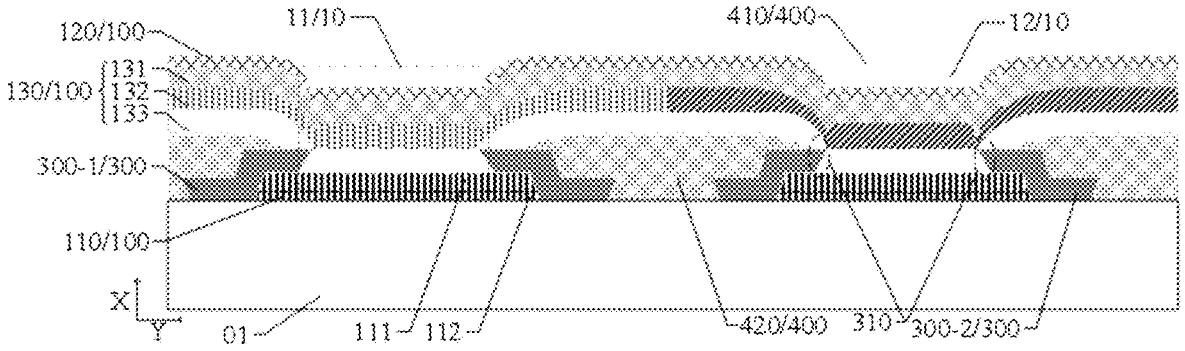
FIG. 2 is a partial structural view taken along line BB' shown in FIG. 1, which is provided by an example of the embodiment of the present disclosure.

FIG. 1 is a planar view of a display substrate provided by an embodiment of the present disclosure, and FIG. 2 is a partial structural view taken along line BB' shown in FIG. 1, which is provided by an example of the embodiment of the present disclosure. As shown in FIGS. 1 and 2, the display substrate includes a display region AA. For example, the display substrate further includes a peripheral region located at the periphery of the display region AA. For example, the peripheral region can surround the display region AA or only be located on at least one side of the display region AA.

As shown in FIGS. 1 and 2, the display substrate includes a base substrate 01 and a plurality of sub-pixels 10 located on the base substrate 01, at least some sub-pixels 10 located in the display region AA include a light emitting element 100, the light emitting element 100 includes a light emitting functional layer 130, and a first electrode 110 and a second electrode 120 which are located at both sides of the light emitting functional layer 130 along a direction perpendicular to the base substrate 01, the first electrode 110 is located between the light emitting functional layer 130 and the base substrate 01, and the light emitting functional layer 100 includes a plurality of film layers. For example, the plurality of film layers in the light emitting functional layer 130 include a light emitting layer and a common layer. For example, the light emitting element 100 can be an organic light emitting element.

As shown in FIG. 2, the display substrate further includes at least one first defining structure 300 located between at least two adjacent sub-pixels 10, the first defining structure 300 includes an end portion 310 located between the light emitting functional layer 130 and the first electrode 110, and the first electrode 110 overlaps with the end portion 310 in the direction perpendicular to the base substrate 01; at least one of the plurality of film layers included in the light emitting functional layer 130 in at least one sub-pixel 10 is disconnected at the end portion 310 of the first defining structure 300. In the display substrate provided by the embodiment of the present disclosure, the first defining structure is set to break at least part of the film layers in the light emitting functional layer, which is helpful to reduce the probability of the occurrence of lateral leakage current between pixels, and further to improve the display quality of the display substrate when it is used for display.

For example, as shown in FIG. 2, the first electrodes 110 of adjacent sub-pixels 10 are spaced apart from each other. For example, the second electrode 120 of at least some sub-pixels 10 is a continuous whole-surface film layer, that is, the second electrode 120 is a common electrode shared by at least some the sub-pixels 10. For example, the first electrode 110 can be an anode, and the second electrode 120 can be a cathode. For example, the cathode can be made of a material with high conductivity and low work function, and for example, the cathode can be made of a metal material. For example, the anode can be formed of a transparent conductive material with a high work function.

For example, the material of the first electrode 110 at least includes a crystalline structure, which is helpful to improve the service life of the first electrode. For example, the material of the first electrode 110 can include indium tin oxide (ITO). For example, indium tin oxide can have a crystalline structure.

For example, as shown in FIG. 2, the first electrode 110 includes a plurality of electrode layers, such as an electrode layer 111 and an electrode layer 112; and at least the electrode layer closest to the light emitting functional layer 130 in the plurality of electrode layers includes a crystalline structure, and for example, the electrode layer 111 includes the crystalline structure. For example, the plurality of electrode layers all include a crystalline structure.

For example, as shown in FIG. 2, in the direction perpendicular to the base substrate 01, e.g., the X direction in the figure, only part of the first defining structure 300 overlaps with the first electrode 110 of the light emitting element 100.

For example, as shown in FIG. 2, the side surface of the end portion 310 of the first defining structure 300 includes an inclined surface, and one end of the inclined surface away from the base substrate 01 is inclined to a center of the sub-pixel 10 in which the light emitting functional layer 100 is disconnected by the end portion 310. For example, the side surface of the end portion 310 is a surface intersected with a main surface (a surface perpendicular to the X direction) of the base substrate 01. For example, the inclined surface can be a part of the side surface of the end portion 310 away from the base substrate 01. For example, the inclined surface can be a side surface of the position where the end portion 310 is used to disconnect at least one film layer of the light emitting functional layer 130.

For example, FIG. 2 illustratively shows two adjacent sub-pixels arranged along the Y direction, these two sub-pixels correspond to two first defining structures 300-1 and 300-2. For example, the first defining structure 300-1 and the first defining structure 300-2 are both ring-shaped structures surrounding the first electrodes 110 of the corresponding light emitting elements 100. The inclined surface of the end portion 310 of the first defining structure 300-1 can be a ring-shaped inclined surface (such as a closed ring-shaped inclined surface or a non-closed ring-shaped inclined surface), and the distance between the ring-shaped inclined surface and the straight line, extending in the X direction, in which the luminous center of the sub-pixel 10 surrounded by the ring-shaped inclined surface is located, gradually decreases along the X direction. For example, the shape of the cross-section, taken by the XY plane, of the film layer disconnected by the inclined surface of the first defining structure 300-1 in the light emitting functional layer 130, can be a trapezoid, and the length of the bottom of the trapezoid away from the base substrate 01 is less than the length of the bottom of the trapezoid close to the base substrate 01.

For example, as shown in FIG. 2, the shape of the end portion 310 of the first defining structure 300 can be undercut-shaped. For example, the end portion 310 of the first defining structure 300 can be a tip for disconnecting at least one film layer of the light emitting functional layer 130.

For example, as shown in FIG. 2, the included angle between the side surface of the end portion 310 of the first defining structure 300 and the main surface of the base substrate 01 can be in the range of 10-90 degrees. For example, the included angle between the side surface of the end portion 310 of the first defining structure 300 and the main surface of the base substrate 01 can be in the range of 20-80 degrees. For example, the included angle between the side surface of the end portion 310 of the first defining structure 300 and the main surface of the base substrate 01 can be in the range of 30-70 degrees. For example, the included angle between the side surface of the end portion 310 of the first defining structure 300 and the main surface of the base substrate 01 can be in the range of 40-60 degrees. For example, the included angle between the side surface of the end portion 310 of the first defining structure 300 and the main surface of the base substrate 01 can be in the range of 45-75 degrees.

For example, as shown in FIG. 2, at least a part of the first defining structure 300 can be located on a surface of the first electrode 110 away from the base substrate 01, and for example, on the first electrode 110. For example, a thickness of the first defining structure 300 on the first electrode 110 can be in the range of 10-200 nanometers. For example, the thickness of the first defining structure 300 on the first electrode 110 can be in the range of 20-190 nanometers. For example, the thickness of the first defining structure 300 on the first electrode 110 can be in the range of 30-180 nanometers. For example, the thickness of the first defining structure 300 on the first electrode 110 can be in the range of 40-170 nanometers. For example, the thickness of the first defining structure 300 on the first electrode 110 can be in the range of 50-160 nanometers. For example, the thickness of the first defining structure 300 on the first electrode 110 can be in the range of 60-150 nanometers. For example, the thickness of the first defining structure 300 on the first electrode 110 can be in the range of 70-140 nanometers. For example, the thickness of the first defining structure 300 on the first electrode 110 can be in the range of 80-130 nanometers. For example, the thickness of the first defining structure 300 on the first electrode 110 can be in the range of 90-120 nanometers. For example, the thickness of the first defining structure 300 on the first electrode 110 can be in the range of 100-110 nm.

In the embodiment of the present disclosure, by setting the included angle between the side surface of the end portion of the first defining structure and the base substrate and setting the thickness of the part of the first defining structure located on the first electrode, the thickness of the light emitting functional layer disconnected by the end portion can be adjusted; for example, all the film layers of the light emitting functional layer are disconnected, or only some of the film layers of the light emitting functional layer close to the base substrate are disconnected (for example, part of the film layers of the light emitting functional layer away from the base substrate can be continuous), so that the second electrode will not be disconnected by the end portion of the first defining structure, thus playing a role in preventing crosstalk between adjacent sub-pixels, and at the same time, the second electrode is not disconnected and the display uniformity is ensured.

For example, in the case where the thickness of the first defining structure 300 on the first electrode 110 is not more than 100 nanometers, the second electrode 120 on a side of the light emitting functional layer 130 away from the base substrate 01 may not be disconnected, thus ensuring the display uniformity.

For example, the material of the first defining structure 300 includes an inorganic nonmetallic material. For example, the material of the first defining structure 300 can include any one or more of silicon nitride, silicon oxide or silicon oxynitride. For example, the first defining structure 300 can include one defining layer or a plurality of defining layers. For example, the first defining structure includes a plurality of defining layers, and the materials of the defining layers of different layers are different.

For example, as shown in FIG. 2, the display substrate further includes a pixel defining pattern 400, the pixel defining pattern 400 is located at a side of the first electrode 110 of the light emitting element 100 away from the base substrate 01, the pixel defining pattern 400 includes a plurality of openings 410, one sub-pixel 10 corresponds to at least one opening 410, at least part of the light emitting element 100 of the sub-pixel 10 is located in the opening 410 corresponding to the sub-pixel 10, and at least part of the first electrode 110 overlaps with the opening 410. For example, the opening 410 is configured to expose the first electrode 110. For example, the pixel defining pattern 400 includes a second defining structure 420 surrounding the opening 410, and the second defining structure 420 covers at least part of the first defining structure 410. For example, a first electrode 110, a light emitting functional layer 130 and a second electrode 120 which are stacked, are provided in the opening 410, and the first electrode 110 and the second electrode 120 located at both sides of the light emitting functional layer 130 can drive the light emitting functional layer 130 in the opening 410 to emit light, so as to form a light emitting region. For example, the above-mentioned light emitting region can refer to a region where the sub-pixel effectively emits light, and the shape of the light emitting region refers to a two-dimensional shape. For example, the shape of the light emitting region can be the same as the shape of the opening 410 of the pixel defining pattern 400.

For example, as shown in FIG. 2, the part of the pixel defining pattern 400 other than the opening 410 is the second defining structure 420, and the material of the second defining structure 420 can include polyimide, acrylic or polyethylene terephthalate, etc.

For example, as shown in FIG. 2, the distance between the surface, away from the base substrate 01, of the first defining structure 300 on the first electrode 110 and the base substrate 01 is less than the maximum distance between the surface, away from the base substrate 01, of the second defining structure 420 and the base substrate 01.

For example, as shown in FIG. 2, the opening 410 corresponding to at least one sub-pixel 10 exposes at least part of the end portion 310 of the first defining structure 300, so that at least one of the plurality of film layers included in the light emitting functional layer 130 is disconnected at the end portion 310.

In the embodiment of the present disclosure, by setting the angle of the end portion of the first defining structure, the thickness of the part of the first defining structure on the first electrode, and the positional relationship between the first defining structure and the second defining structure, at least one film layer of the light emitting functional layer of at least one sub-pixel can be disconnected at the end portion of the first defining structure, so as to solve the problem of lateral leakage between sub-pixels, thereby improving the display quality when the display substrate is used for display.

For example, as shown in FIG. 2, the plurality of film layers included in the light emitting functional layer 130 include a light emitting layer 132 and at least one of common layers 131 and 133, and the at least one of the common layers 131 and 133 is a film layer shared by at least two sub-pixels 10. For example, common layers 131 and 133 include a hole injection layer (HIL), a hole transport layer (HTL), an electron transport layer (ETL) and an electron injection layer (EIL). For example, common layers 131 and 133 can further include a hole blocking layer (HBL), an electron blocking layer (EBL), a micro-cavity adjusting layer, an exciton adjusting layer or any other functional film layer.

For example, as shown in FIG. 2, the common layer 131 can include a hole injection layer and a hole transport layer, and the common layer 131 can include an electron transport layer and an electron injection layer. For example, the hole blocking layer is located between the light emitting layer 132 and the second electrode 120. For example, the electron blocking layer is located between the light emitting layer 132 and the first electrode 110.

For example, the light emitting functional layer can further include a plurality of layer stacks; for example, the first layer stack includes a first light emitting layer, the second layer stack includes a second light emitting layer, and the first layer stack and the second layer stack can further include one or more of a hole injection layer (HIL), a hole transport layer (HTL), an electron transport layer (ETL), an electron injection layer (EIL), a hole blocking layer, an electron blocking layer, a micro-cavity adjusting layer, an exciton adjusting layer or any other functional film layer. A charge generation layer (CGL) can be included between the first layer stack and the second layer stack. The charge generation layer (CGL) can include an n-doped charge generation layer (CGL) and/or a p-doped charge generation layer (CGL), and the charge generation layer can be one layer of the common layers. Of course, in order to further improve the luminous efficiency, the light emitting functional layer can further include three or more layer stacks.

For example, as shown in FIG. 2, only some of the plurality of film layers included in the light emitting functional layer 130 are disconnected at the end portion 310 of the first defining structure 300. For example, at least one film layer in the light emitting functional layer 130 of at least one sub-pixel 10 is continuously arranged at a partial position at the edge of the opening 410 corresponding to the at least one sub-pixel. For example, among the plurality of film layers included in the light emitting functional layer 130 of at least one sub-pixel 10, at least one film layer away from the base substrate 01 is continuously arranged at the edge position of the opening 410 where the at least one film layer is located.

For example, as shown in FIG. 2, at least one of the common layers 131 and 133 is disconnected at the end portion 310 of the first defining structure 300. For example, the common layer 133 located at a side of the light emitting layer 132 facing the base substrate 01 is disconnected at the end portion 310 of the first defining structure 300. For example, the common layers 131 and 133 located at both sides of the light emitting layer 132, and the light emitting layer 132 are all disconnected at the end portion 310 of the first defining structure 300.

For example, as shown in FIG. 2, in at least one sub-pixel 10, the second electrode 120 of the light emitting element 100 is continuously arranged at the end portion 310 of the first defining structure 300. For example, the second electrodes 120 of sub-pixels of the same color are continuously arranged at the end portion 310 of the first defining structure 300. For example, the second electrodes 120 of blue sub-pixels are continuously arranged at the end portion 310 of the first defining structure 300. For example, the second electrodes 120 of sub-pixels of different colors are continuously arranged at the end portion 310 of the first defining structure 300. For example, the second electrodes 120 of red sub-pixels are continuously arranged at the end portion 310 of the first defining structure 300. For example, the second electrodes 120 of green sub-pixels are continuously arranged at the end portion 310 of the first defining structure 300.

Of course, the embodiment of the present disclosure is not limited thereto. In the case where all the film layers included in the light emitting functional layer are disconnected at the end portion of the first defining structure, the second electrode may be completely disconnected at the end portion of the first defining structure, or may not be completely disconnected at the end portion of the first defining structure.

For example, as shown in FIG. 2, the light emitting layers 132 of adjacent sub-pixels 10 can be connected, but it is not limited thereto. For example, the light emitting layers of adjacent sub-pixels can overlap or be arranged at intervals, and the positional relationship of the light emitting layers of adjacent sub-pixels can be set according to product requirements.

Figure 3:
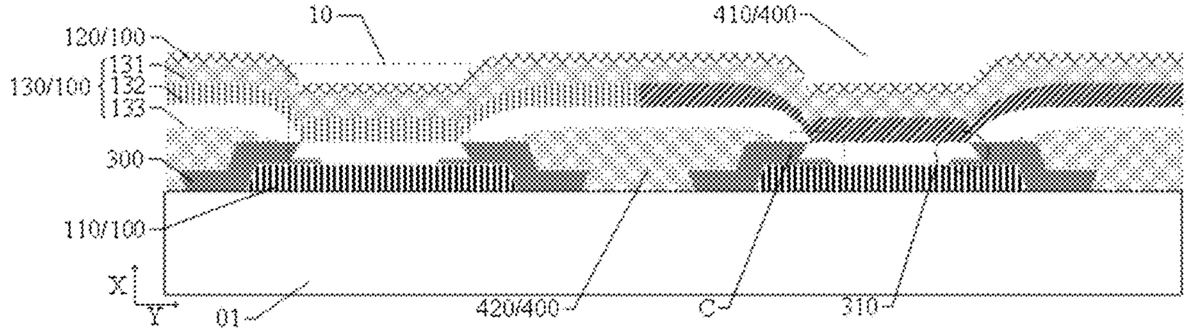
FIG. 3 is a partial structural view taken along line BB' shown in FIG. 1, which is provided by another example of the embodiment of the present disclosure.
Figure 4:
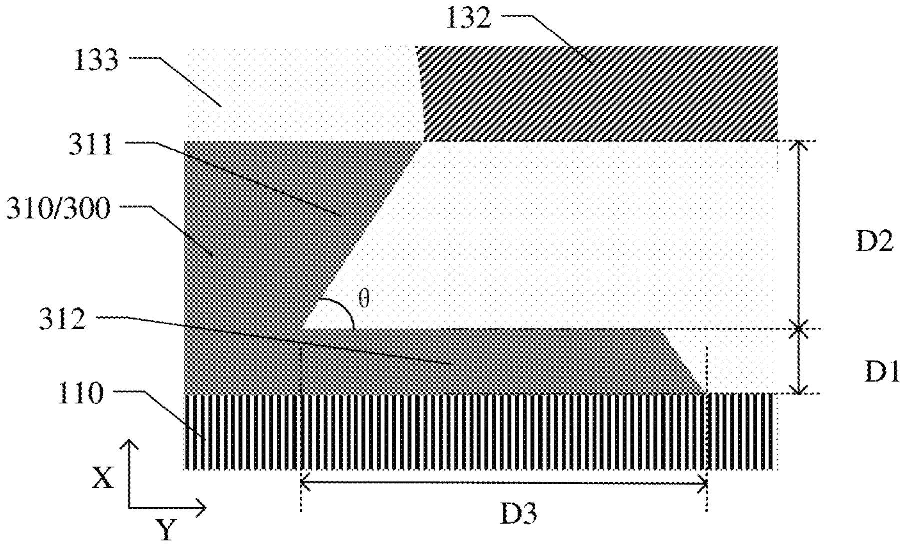
FIG. 4 is a partial enlarged structural view of position C shown in FIG. 3.

FIG. 3 is a partial structural view taken along line BB' shown in FIG. 1, which is provided by another example of the embodiment of the present disclosure, and FIG. 4 is a partial enlarged structural view of position C shown in FIG. 3. For example, as shown in FIGS. 3 and 4, the end portion 310 of the first defining structure 300 includes a partition part 311 and a buffer part 312, and the buffer part 312 is located at a side of the partition portion 311 close to the base substrate 01. For example, the partition part 311 and the buffer part 312 can be an integrated structure formed in the same process by using the same material.

For example, as shown in FIGS. 3 and 4, the buffer part 312 protrudes relative to the edge of the partition part 311 and extends to the center of the sub-pixel in which the light emitting functional layer 130 is disconnected by the end portion 310. For example, the partition part 311 and the buffer part 312 are formed in a shape similar to a step-like shape. For example, two buffer parts 312 of two end portions 310 located at both sides of the center of the sub-pixel 10 in the Y direction both extend to the center of the sub-pixel, and the partition part 311 is located in the direction where the buffer part 312 is away from the center of the sub-pixel. For example, in the case where the end portion 310 has a ring-shaped structure (as described later), the buffer part 312 can have an inner ring structure, and the partition part 311 can have an outer ring structure.

For example, as shown in FIGS. 3 and 4, in the direction perpendicular to the base substrate 01, the thickness D2 of the partition part 311 is greater than the thickness D1 of the buffer part 312, so as to disconnect at least part of the film layers of the light emitting functional layer 130.

For example, as shown in FIGS. 3 and 4, in the direction perpendicular to the base substrate 01, the thickness D2 of the partition part 311 can be in the range of 20 nm to 120 nm, such as 30 nm to 110 nm, such as 40 nm to 100 nm, such as 50 nm to 90 nm, such as 60 nm to 80 nm. For example, in the direction perpendicular to the base substrate 01, the thickness D1 of the buffer part 312 can be in the range of 0 nm to 50 nm, such as 5 nm to 45 nm, such as 10 nm to 40 nm, such as 15 nm to 35 nm, such as 20 nm to 30 nm. In the case where the thickness of the buffer part 312 is 0, the end portion 310 may not be provided with the buffer part 312.

For example, as shown in FIGS. 3 and 4, the size D3 of the buffer part 312 between two adjacent sub-pixels 10 in the direction parallel to the connecting line of centers of the two adjacent sub-pixels 10 can be in the range of 0 nm to 300 nm. For example, the size D3 of the protrusion of the buffer part 312 relative to the partition part 311 can be in the range of 0 nm to 300 nm. For example, in the cross-sectional view shown in FIG. 3, the size D3 of the buffer part 312 in the Y direction can be in the range of 0 nm to 300 nm. For example, the size D3 of the buffer part 312 in the Y direction can be in the range of 10 nm to 290 nm, such as 20 nm to 280 nm, such as 30 nm to 270 nm, such as 40 nm to 260 nm, such as 50 nm to 250 nm, such as 60 nm to 240 nm, such as 70 nm to 230 nm, such as 80 nm to 220 nm, such as 90 nm to 210 nm, such as 100 nm to 200 nm, such as 110 nm to 190 nm, such as 120 nm to 180 nm, such as 130 nm to 170 nm, such as 140 nm to 150 nm.

For example, in the case where the end portion 310 has a ring-shaped structure (described later), the ring width of the buffer part 312 can be D3 as described above.

For example, as shown in FIGS. 3 and 4, the side surface of the partition part 311 can be an inclined side surface, and the end of the inclined side surface away from the base substrate 01 is inclined to the center of the sub-pixel 10 in which the light emitting functional layer 100 is disconnected by the end portion 310. For example, the included angle θ between the inclined side surface of the partition part 311 and the main surface of the base substrate 01 can be in the range of 10-89 degrees. For example, the included angle θ between the inclined side surface of the partition part 311 and the main surface of the base substrate 01 can be in the range of 50-80 degrees. For example, the included angle θ between the inclined side surface of the partition part 311 and the main surface of the base substrate 01 can be in the range of 60-70 degrees. Of course, the embodiment of the present disclosure is not limited to the case that the side surface of the partition part is an inclined side surface, and the side surface can also be a surface perpendicular to the main surface of the base substrate, or the included angle between the side surface and the main surface of the base substrate is not limited to an acute angle or a right angle, but also can be an obtuse angle; and at least one film layer of the light emitting functional layer can be disconnected by adjusting the included angle between the side surface of the partition part and the surface of the partition part away from the base substrate.

In the embodiment of the present disclosure, by setting the first defining structure located on the first electrode as a structure including the partition part and the buffer part, it is helpful to prevent the second electrode from being disconnected at the end portion of the first defining structure.

In the embodiment of the present disclosure, by setting the thicknesses of the partition part and the buffer part, the inclination angle of the inclined side surface of the partition part, and the elongation size of the buffer part relative to the partition part, only at least part of the film layers of the light emitting functional layer are disconnected, while the second electrode is not disconnected.

For example, as shown in FIGS. 2 and 3, the second defining structure 420 is a closed ring-shaped structure, and the first defining structure 300 can be a closed ring-shaped structure or a non-closed ring-shaped structure. For example, the aperture of the opening surrounded by the first defining structure 300 is smaller than the aperture of the opening surrounded by the second defining structure 420.

For example, the second defining structure 420 includes a slope surrounding the opening 410, and the slope angle of the slope is smaller than the included angle θ between the inclined side surface of the partition part 311 and the main surface of the base substrate 01.

The slope angle of the second defining structure as mentioned above can refer to the included angle between the Y direction and the tangent line at the intersection of the curve of the slope taken along the XY plane and the first defining structure or the first electrode. However, it is not limited thereto. For example, the slope angle of the second defining structure can refer to the included angle between the tangent line at the midpoint of the curve of the slope taken along the XY plane and the Y direction.

For example, the part of the slope of the second defining structure 420 close to the base substrate 01 is closer to the center of the light emitting region than the part of the slope of the second defining structure 420 away from the base substrate 01. For example, the included angle between the surface of the second defining structure 420 facing the center of the light emitting region and a plane perpendicular to the X direction is greater than the included angle between the inclined side surface of the partition part 311 of the first defining structure and the main surface of the base substrate 01.

Figure 5:
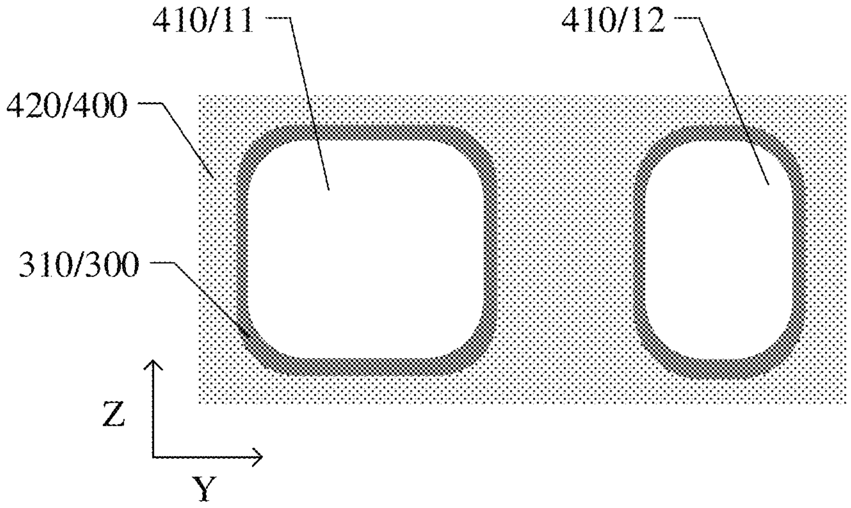
FIG. 5 is a partial planar structural view of two sub-pixels in FIG. 2, which is provided by an example of the embodiment of the present disclosure.

FIG. 5 is a partial planar structural view of two sub-pixels in FIG. 2, which is provided by an example of the embodiment of the present disclosure. For example, as shown in FIGS. 2 and 5, the first defining structure 300 surrounds and covers one circle of edge of the first electrode 110 of at least one sub-pixel 10. For example, the display substrate includes a sub-pixel 11 and a sub-pixel 12 arranged adjacent to each other in the Y direction. The present example illustratively shows that the sub-pixel 11 and the sub-pixel 12 are sub-pixels emitting light of different colors, but it is not limited thereto, and these two sub-pixels can also be sub-pixels emitting light of the same color.

For example, as shown in FIGS. 2 and 5, the first defining structure 300 includes a plurality of first defining structures 300, two first defining structures 300 are arranged between the centers of two adjacent sub-pixels 10, and a gap is arranged between the two first defining structures 300. For example, the sub-pixel 11 and the sub-pixel 12 correspond to two first defining structures 300, each of the two first defining structures 300 surrounds and covers one circle of edge of the first electrode 110 of the corresponding sub-pixel 10, and the two first defining structures are spaced apart. For example, the "being spaced apart" can include the case that the first defining structures corresponding to two adjacent sub-pixels are separated from each other and are not connected.

In the display substrate provided by the embodiment of the present disclosure, the first defining structure surrounds and covers one circle of edge of the first electrode of the light emitting element of the sub-pixel, which is helpful to prevent the edge material of the first electrode (such as silver ions) from falling off. In addition, the first defining structure provided by the present example is not provided as a whole-layer structure, which can prevent the first defining structure from falling off due to poor adhesion with the material of the film layer (e.g., a planarization layer) at a side of the first defining structure facing the base substrate.

For example, as shown in FIGS. 2 and 5, at least one first defining structure 300 is a ring-shaped structure surrounding the first electrode 110 of a corresponding sub-pixel 10, and the ring-shaped structure can be a closed ring-shaped structure. For example, at least one first defining structure 300 is a ring-shaped structure surrounding the first electrode 110 of a corresponding sub-pixel 10, and the end portion 310 of the ring-shaped structure exposed by the opening 410 corresponding to the sub-pixel 10 is a ring-shaped end portion, so that at least one film layer of the light emitting functional layer in the sub-pixel 10 is disconnected at one circle of edge of the corresponding opening 410, which can reduce the crosstalk between the sub-pixel 11 and the sub-pixel 12.

For example, the shape of the end portion 310 of the first defining structure 300 exposed by the opening 410 of the pixel defining pattern 400 can be a ring shape with a uniform ring width. For example, the ring width of the ring-shaped end portion 310 of the first defining structure 300 exposed by the opening 410 of the pixel defining pattern 400 can be in the range of 0 nm to 400 nm. For example, the ring width of the ring-shaped end portion 310 of the first defining structure 300 exposed by the opening 410 of the pixel defining pattern 400 can be in the range of 10 nm to 390 nm. For example, the ring width of the ring-shaped end portion 310 of the first defining structure 300 exposed by the opening 410 of the pixel defining pattern 400 can be in the range of 20 nm to 380 nm. For example, the ring width of the ring-shaped end portion 310 of the first defining structure 300 exposed by the opening 410 of the pixel defining pattern 400 can be in the range of 30 nm to 370 nm. For example, the ring width of the ring-shaped end portion 310 of the first defining structure 300 exposed by the opening 410 of the pixel defining pattern 400 can be in the range of 50 nm to 350 nm. For example, the ring width of the ring-shaped end portion 310 of the first defining structure 300 exposed by the opening 410 of the pixel defining pattern 400 can be in the range of 70 nm to 300 nm. For example, the ring width of the ring-shaped end portion 310 of the first defining structure 300 exposed by the opening 410 of the pixel defining pattern 400 can be in the range of 100 nm to 280 nm. For example, the ring width of the ring-shaped end portion 310 of the first defining structure 300 exposed by the opening 410 of the pixel defining pattern 400 can be in the range of 120 nm to 250 nm. For example, the ring width of the ring-shaped end portion 310 of the first defining structure 300 exposed by the opening 410 of the pixel defining pattern 400 can be in the range of 150 nm to 200 nm. For example, the ring width of the ring-shaped end portion 310 of the first defining structure 300 exposed by the opening 410 of the pixel defining pattern 400 can be in the range of 120 nm to 180 nm. For example, the ring width of the ring-shaped end portion 310 of the first defining structure 300 exposed by the opening 410 of the pixel defining pattern 400 can be in the range of 30 nm to 120 nm. For example, the ring width of the ring-shaped end portion 310 of the first defining structure 300 exposed by the opening 410 of the pixel defining pattern 400 can be in the range of 40 nm to 170 nm.

For example, the ratio of the ring widths of the exposed ring-shaped end portions 310 of the first defining structures 300 corresponding to different color sub-pixels can be in the range of 0.5-1.5. For example, the ratio of the ring widths of the exposed ring-shaped end portions 310 of the first defining structures 300 corresponding to different color sub-pixels can be in the range of 0.6-1.4. For example, the ratio of the ring widths of the exposed ring-shaped end portions 310 of the first defining structures 300 corresponding to different color sub-pixels can be in the range of 0.7-1.3. For example, the ratio of the ring widths of the exposed ring-shaped end portions 310 of the first defining structures 300 corresponding to different color sub-pixels can be in the range of 0.8-1.2. For example, the ratio of the ring widths of the exposed ring-shaped end portions 310 of the first defining structures 300 corresponding to different color sub-pixels can be in the range of 0.9-1.1.

For example, the embodiment of the present disclosure is not limited to the case that the first defining structure is a closed ring structure, or the case that the first defining structure is a non-closed ring structure. For example, the first defining structure can be a strip-shaped structure, and the strip-shaped structure covers the edge of the first electrode of at least one of two adjacent sub-pixels that are close to the strip-shaped structure, so as to avoid crosstalk between the two adjacent sub-pixels that are close to the strip-shaped structure.

Figure 6A:
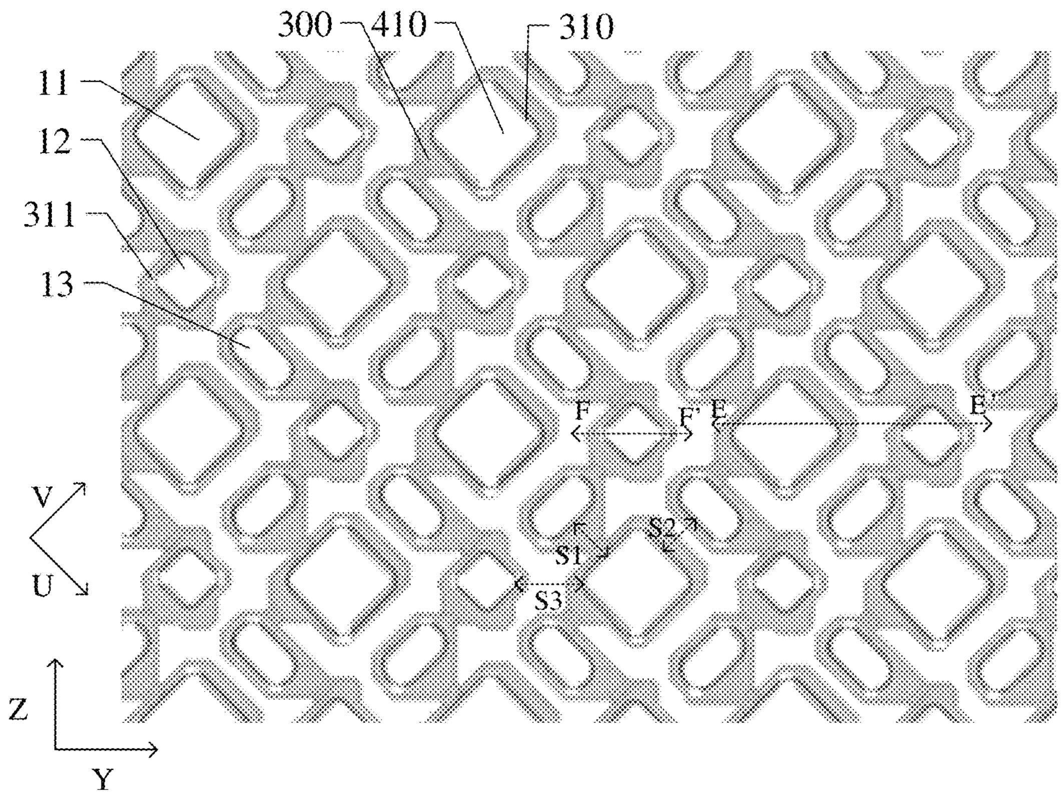
FIG. 6A is a partial planar structural view of region D shown in FIG. 1, which is provided by another example of the embodiment of the present disclosure.
Figure 7:
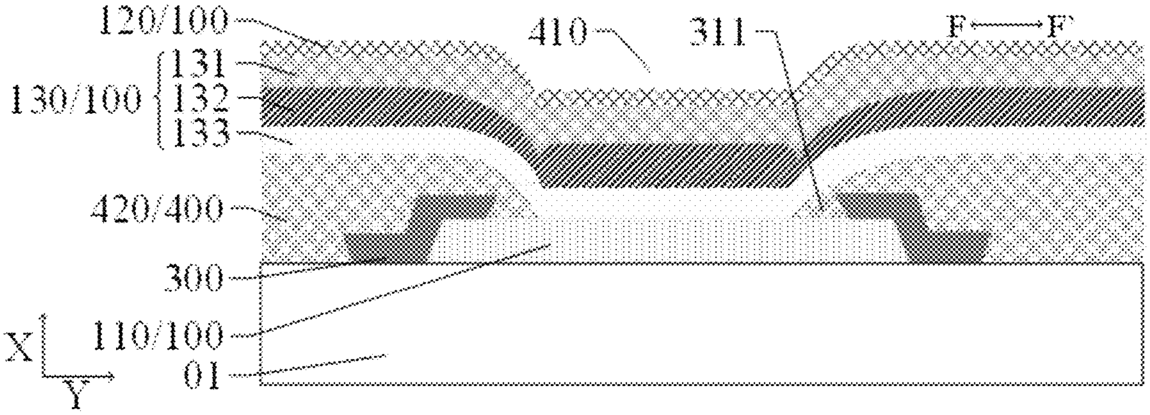
FIG. 7 is a partial cross-sectional structural view taken along line FF' shown in FIG. 6A.

FIG. 6A is a partial planar structural view of region D shown in FIG. 1, which is provided by another example of the embodiment of the present disclosure. FIG. 2 or FIG. 3 can be a partial ross-sectional structural view taken along line EE' shown in FIG. 6A, and FIG. 7 is a partial cross-sectional structural view taken along line FF' shown in FIG. 6A. For example, as shown in FIGS. 6A and 7, the first defining structure 300 includes an ring-shaped first defining structure 300 surrounding the first electrode 110 of at least one sub-pixel 10, and the opening 410 corresponding to the at least one sub-pixel 10 only exposes a part of the ring-shaped first defining structure 300, so that the plurality of film layers included in the light emitting functional layer 130 are continuously arranged at the position of the ring-shaped first defining structure 300 not exposed by the opening 410.

For example, the second defining structure 420 of the pixel defining pattern 400 covers only a part of the ring-shaped first defining structure 300.

The display substrate shown in this example is different from the display substrate shown in FIG. 5 in that there is a notch 311, of the ring-shaped first defining structure 300, at the overlapping position between the ring-shaped first defining structure 300 and the edge of the opening 410 corresponding thereto in the present example, and all the film layers of the light emitting functional layer 130 are continuously arranged without being disconnected at the position of the notch 311. For example, in the opening 410 and the ring-shaped first defining structure 300 which correspond to one sub-pixel, the ratio of the edge of the opening 410 corresponding to the notch 311 to one circle of edge of the opening 410 can be in the range of 0.1-0.9. For example, the ratio of the edge of the opening 410 corresponding to the notch 311 to one circle of edge of the opening 410 can be in the range of 0.2-0.8. For example, the ratio of the edge of the opening 410 corresponding to the notch 311 to one circle of edge of the opening 410 can be in the range of 0.3-0.7. For example, the ratio of the edge of the opening 410 corresponding to the notch 311 to one circle of edge of the opening 410 can be in the range of 0.4-0.6. For example, the ratio of the edge of the opening 410 corresponding to the notch 311 to one circle of edge of the opening 410 can be 0.5.

In the present example, by setting the shape of the part of the first defining structure exposed by the opening of the pixel defining pattern, at least one film layer of the light emitting functional layer of adjacent sub-pixels can be physically separated, and at the same time, the second electrode of the adjacent sub-pixels is not disconnected, thus not only solving the problem of lateral leakage between adjacent pixels, but also preventing the occurrence of pixel failure caused by the breakage of the second electrode.

For example, as shown in FIGS. 6A and 7, the first defining structure 300 surrounds and covers at least part of one circle of edge of the first electrode 110 of at least one sub-pixel 10.

In the display substrate provided by the embodiment of the present disclosure, the first defining structure surrounds and covers one circle of edge of the first electrode of the light emitting element of the sub-pixel, which is helpful to prevent the edge material of the first electrode (such as silver ions) from falling off.

For example, as shown in FIGS. 6A and 7, the ring-shaped first defining structure 300 can be a closed ring-shaped structure including the notch 311 mentioned above. Of course, the embodiment of the present disclosure is not limited thereto, and other components of the first defining structure may not be provided at the position corresponding to the notch. In this case, the first defining structure is a ring-shaped non-closed structure.

For example, as shown in FIG. 6A, the first defining structures 300 corresponding to at least some of the sub-pixels 10 can be connected into an integrated structure, so as to reduce the patterning accuracy of the first defining structures. For example, the first defining structures 300 corresponding to adjacent sub-pixels 10 can be a continuous structure. The "first defining structure corresponding to a sub-pixel" in the embodiment of the present disclosure refers to the first defining structure surrounding or covering the first electrode of the sub-pixel.

For example, as shown in FIG. 6A, the plurality of sub-pixels 10 are arrayed along a first direction and a second direction, one of the U direction and the V direction as shown in FIG. 6A can be the first direction, and the other of the U direction and the V direction as shown in FIG. 6A is the second direction. For example, the distance between edges, close to each other, of the light emitting regions of two adjacent sub-pixels 10 arranged along the first direction (e.g., the U direction) is a first distance S1, the distance between edges, close to each other, of the light emitting regions of two adjacent sub-pixels 10 arranged along the second direction (e.g., the V direction) is a second distance S2, the distance between edges, close to each other, of the light emitting regions of two adjacent sub-pixels 10 arranged along a third direction (e.g., one of the Y direction and the Z direction, the figure illustratively shows that the third direction is the Y direction) intersected with both the first direction and the second direction is a third distance S3, and both the first distance S1 and the second distance S2 are less than the third distance S3. For example, the first distance S1 and the second distance S2 may or may not be equal.

For example, the first direction is intersected with the second direction. For example, the first direction and the second direction may or may not be perpendicular to each other. For example, the first direction and the second direction can be interchanged.

For example, as shown in FIG. 6A, while the plurality of sub-pixels 10 are arrayed along the first direction and the second direction, the plurality of sub-pixels 10 are also arrayed along the Y direction and the Z direction. For example, the Y direction is intersected with the Z direction. For example, the Y direction is perpendicular to or not perpendicular to the Z direction. For example, the Y direction and the Z direction can be interchanged.

For example, as shown in FIGS. 6A and 7, at least one film layer of the light emitting functional layer 130 of at least one of two adjacent sub-pixels 10 arranged along the third direction is continuously arranged at the position of adjacent edges, close to each other, of the light emitting regions of the two adjacent sub-pixels 10. In the present example, by setting the shape of the part of the first defining structure exposed by the opening of the pixel defining pattern, at least one film layer of the light emitting functional layers of adjacent sub-pixels arranged along the third direction and with a large spacing can be physically separated, and at the same time, the second electrode of the adjacent sub-pixels is not disconnected, thus not only solving the problem of lateral leakage between adjacent pixels, but also preventing the occurrence of pixel failure caused by the breakage of the second electrode.

For example, as shown in FIG. 6A, the plurality of sub-pixels 10 includes a plurality of first color sub-pixels 11, a plurality of second color sub-pixels 12 and a plurality of third color sub-pixels 13. For example, one of the first color sub-pixel 11 and the second color sub-pixel 12 is configured to emit red light, and the other of the first color sub-pixel 11 and the second color sub-pixel 12 is configured to emit blue light; and the third color sub-pixel 13 is configured to emit green light. FIG. 6A illustratively shows that the first color sub-pixel 11 emits blue light and is a blue sub-pixel; the second color sub-pixel 12 emits red light and is a red sub-pixel; and the third color sub-pixel 13 emits green light and is a green sub-pixel.

For example, as shown in FIG. 6A, the plurality of first color sub-pixels 11 and the plurality of second color sub-pixels 12 are alternately arranged along the Z direction and the Y direction, and the plurality of third color sub-pixels 13 are arrayed along the Z direction and the Y direction. For example, the plurality of first color sub-pixels 11 and the plurality of second color sub-pixels 12 are alternately arranged along the Y direction to form first pixel rows, the plurality of third color sub-pixels 13 are arranged along the Y direction to form second pixel rows, the first pixel rows and the second pixels row are alternately arranged along the Z direction, and the first pixel row and the second pixel row are shifted from each other in the Y direction. For example, the plurality of first color sub-pixels 11 and the plurality of second color sub-pixels 12 are alternately arranged along the Z direction to form first pixel columns, the plurality of third color sub-pixels 13 are arranged along the Z direction to form second pixel columns, the first pixel columns and the second pixel columns are alternately arranged along the Y direction, and the first pixel column and the second pixel column are shifted from each other in the Z direction.

For example, the plurality of first color sub-pixels 11 and the plurality of third color sub-pixels 13 are alternately arranged along both the U direction and the V direction, and the plurality of second color sub-pixels 12 and the plurality of third color sub-pixels 13 are alternately arranged along both the U direction and the V direction.

For example, as shown in FIG. 6A, one column of first defining structures 300 corresponding to one column of third color sub-pixels 13 arranged along the Z direction and one column of first defining structures 300 corresponding to one column of first color sub-pixels 11 and second color sub-pixels 12 adjacent to the one column of third color sub-pixels 13 can be an integrated structure. For example, two columns of first defining structures 300 corresponding to two adjacent columns of third color sub-pixels 13 are separated from each other. For example, the first defining structures 300 corresponding to two adjacent sub-pixels 10 arranged along the Y direction are separated from each other. For example, the first defining structures 300 corresponding to two adjacent sub-pixels 10 arranged along the Z direction are separated from each other.

For example, as shown in FIG. 6A, among the sub-pixels 10 arranged along the U direction or the V direction, the first defining structures 300 corresponding to the first color sub-pixel 11 and the third color sub-pixel 13 located on one side thereof are an integrated structure, and the first defining structures 300 corresponding to the first color sub-pixel 11 and the third color sub-pixel 13 located on the other side thereof are structures separated from each other. For example, among the sub-pixels 10 arranged along the U direction or the V direction, the first defining structures 300 corresponding to the second color sub-pixel 12 and the third color sub-pixel 13 located on one side thereof are an integrated structure, and the first defining structures 300 corresponding to the second color sub-pixel 12 and the third color sub-pixel 13 located on the other side thereof are structures separated from each other. Of course, the embodiment of the present disclosure is not limited thereto. The first defining structures corresponding to two adjacent sub-pixels arranged along the Y direction can be an integrated structure, and the first defining structures corresponding to two adjacent sub-pixels arranged along the Z direction can be an integrated structure.

For example, as shown in FIG. 6A, the ring-shaped end portion 310 of the first defining structure 300 corresponding to each sub-pixel 10 includes at least one notch 311. For example, the first defining structure 300 corresponding to each sub-pixel 10 includes two notches 311 opposite to each other. These two notches 311 can be two notches 311 arranged along the Z direction, or two notches 311 arranged along the Y direction, or two notches 311 arranged along any other direction.

For example, as shown in FIG. 6A, the light emitting region of the first color sub-pixel 11 has a quadrilateral shape which includes four corners, and the notch 311 of the first defining structure 300 corresponding to the first color sub-pixel 11 can be located at a corner of the light emitting region of the first color sub-pixel 11. For example, the light emitting region of the first color sub-pixel 11 includes two corners that are opposite to each other in the Z direction, and the two notches 311 of the first defining structure 300 corresponding to the first color sub-pixel 11 can be arranged along the Z direction.

For example, as shown in FIG. 6A, the light emitting region of the second color sub-pixel 12 has a quadrilateral shape which includes four corners, and the notch 311 of the first defining structure 300 corresponding to the second color sub-pixel 12 can be located at the corner of the light emitting region of the second color sub-pixel 12. For example, the light emitting region of the second color sub-pixel 12 includes two corners that are opposite to each other in the Y direction, and the two notches 311 of the first defining structure 300 corresponding to the second color sub-pixel 12 can be arranged along the Y direction. The embodiment of the present disclosure is not limited to the case that the two notches corresponding to the first color sub-pixel are arranged along the Z direction and the two notches corresponding to the second color sub-pixel are arranged along the Y direction. The two notches corresponding to the first color sub-pixel can also be arranged along the Y direction, and the two notches corresponding to the second color sub-pixel can also be arranged along the Z direction.

For example, as shown in FIG. 6A, the arrangement direction of two notches 311 in the first defining structure 300 corresponding to the first color sub-pixel 11 is intersected with the arrangement direction of two notches 311 in the first defining structure 300 corresponding to the second color sub-pixel 12, and for example, they are the Y direction and the Z direction, respectively. Thus, the second electrodes of the first color sub-pixels 11 and the second color sub-pixels 12 alternately arranged along the Y direction and the Z direction can be continuous at the notch position, so as to realize the continuous arrangement of the second electrodes corresponding to the adjacent first color sub-pixels 11 and second color sub-pixels 12 arranged along the Y direction and the Z direction, and improve the uniformity of the display substrate when it is used for display.

For example, as shown in FIG. 6A, the notches 311 of the first defining structures 300 corresponding to two adjacent third color sub-pixels 13 arranged along the Z direction are arranged opposite to each other, and for example, a straight line extending along the Z direction passes through the notches 311 of the first defining structures 300 corresponding to two adjacent third color sub-pixels 13 arranged along the Z direction.

The embodiment of the present disclosure is not limited to the case that the first defining structure corresponding to each sub-pixel is provided with two notches. For example, the first defining structure corresponding to at least one sub-pixel may be provided with no notch, or with one notch, or with three or more than three notches, so that the second electrodes of the plurality of sub-pixels can be a continuous common electrode, and the situation of breakage can be avoided as much as possible. For example, the first defining structure corresponding to the blue sub-pixel may not be provided with a notch.

Figure 6B:
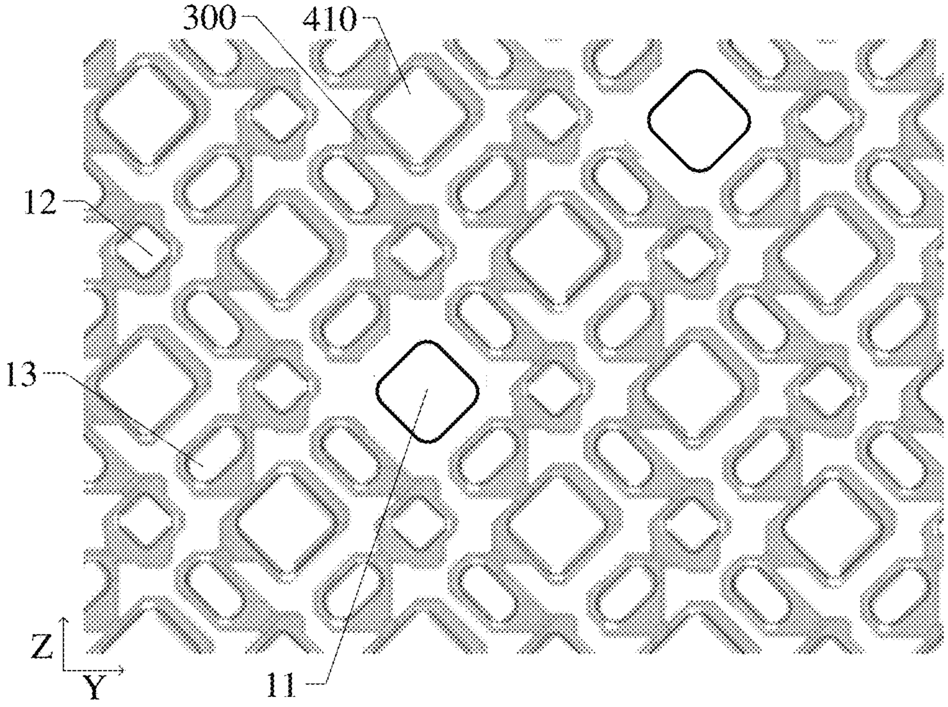
FIG. 6B is a partial planar structural view of region D shown in FIG. 1, which is provided by further another example of the embodiment of the present disclosure.

FIG. 6B is a partial planar structural view of region D shown in FIG. 1, which is provided by further another example of the embodiment of the present disclosure. The display substrate shown in FIG. 6B is different from the display substrate shown in FIG. 6A in that at least one sub-pixel is not provided with a corresponding first defining structure 300. For example, at least two sub-pixels are not provided with corresponding first defining structures 300. For example, at least one color sub-pixel is not provided with a corresponding first defining structure 300.

For example, the blue sub-pixel 11 is not provided with a corresponding first defining structure 300. For example, the red sub-pixel 12 and the green sub-pixel 13 are provided with corresponding first defining structures.

For example, some blue sub-pixels 11 may be provided with corresponding first defining structures 300, while some other blue sub-pixels 11 may not be provided with corresponding first defining structures 300. For example, the blue sub-pixels 11 without corresponding first defining structures 300 can be uniformly distributed. For example, the blue sub-pixels 11 without the corresponding first defining structures 300 can be arranged in odd rows. For example, the blue sub-pixels 11 without the corresponding first defining structure 300 can be arranged every n rows or n columns, where n can be a positive integer greater than or equal to 1.

The embodiment of the present disclosure is not limited thereto, and any color sub-pixel among the red sub-pixel, the blue sub-pixel and the green sub-pixel may not be provided with a corresponding first defining structure.

For example, the first defining structure can be provided only in a partial region. For example, the display region of the display substrate can include a normal display region and an under-screen camera region, and the first defining structure can be arranged in the normal display region, but not in the under-screen camera region. The under-screen camera region mentioned above can refer to a display region for placing an under-screen camera.

For example, the regions shown in FIG. 6B and FIG. 6A can be located in different regions of the display substrate, the region shown in FIG. 6A can be located in the normal display region, and the region shown in FIG. 6B can be located in the under-screen camera region; or the region shown in FIG. 6A can be located in the under-screen camera region, and the region shown in FIG. 6B can be located in the normal display region.

Figure 8:
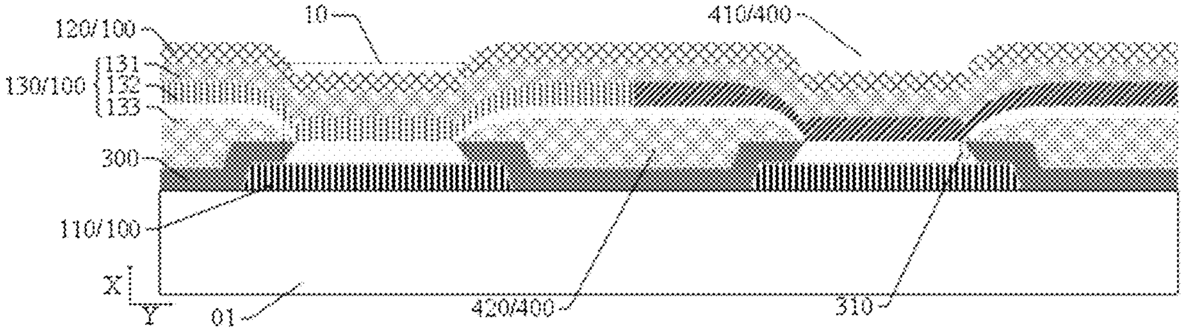
FIG. 8 is a partial structural view taken along line BB' shown in FIG. 1, which is provided by another example of the embodiment of the present disclosure.
Figure 9A:
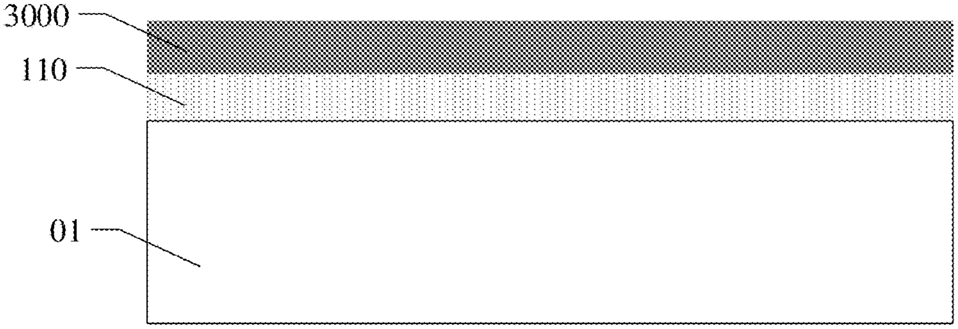
FIGS. 9A-9D are process flow charts of a manufacturing method of a display substrate provided by an example of an embodiment of the present disclosure.
Figure 9B:
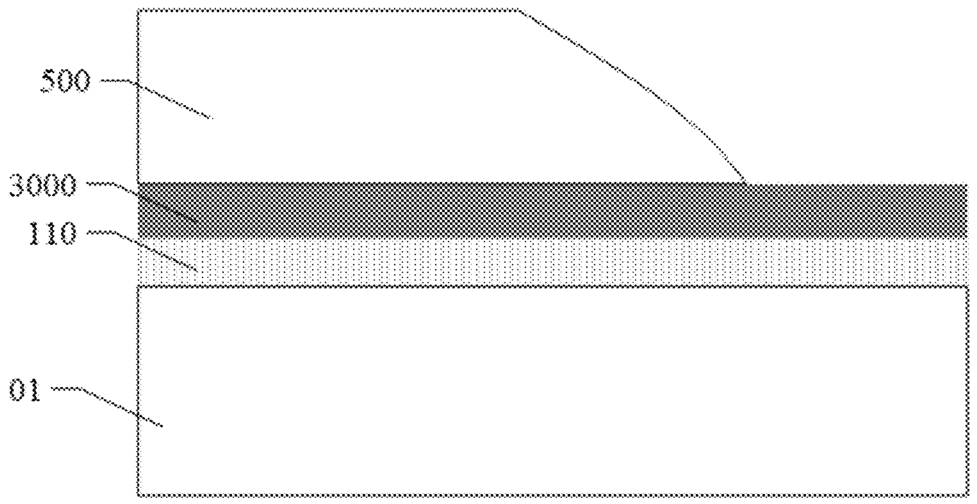
Figure 9C:
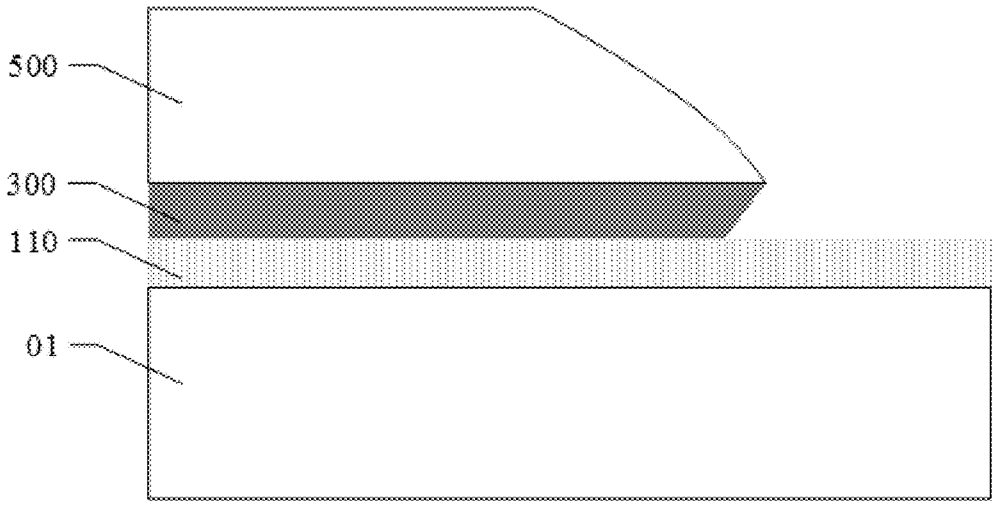
Figure 9D:
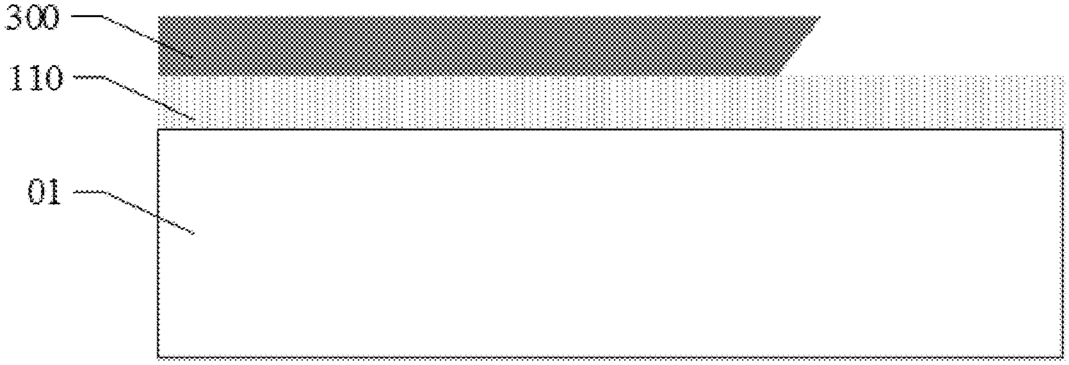

FIG. 8 is a partial structural view taken along line BB' shown in FIG. 1, which is provided by another example of the embodiment of the present disclosure. For example, the display substrate shown in FIG. 8 is different from the display substrate shown in FIG. 2 in the structure of the first defining structure 300 and the positional relationship between the first defining structure 300 and the pixel defining pattern 400. For example, as shown in FIG. 8, an orthographic projection of the second defining structure 420 on the base substrate 01 completely falls within an orthographic projection of the first defining structure 300 on the base substrate 01. For example, the first defining structures 300 corresponding to adjacent sub-pixels 10 can be an integrated structure. For example, the first defining structure 300 can be a pattern including a plurality of openings, and the openings of the first defining structure 300 are configured to expose the light emitting regions of the sub-pixels 10.

For example, as shown in FIG. 8, the size of the protruding part of the end portion 310 of the first defining structure 300 relative to the second defining structure 420 is very small, and for example, in the range of 0.001-10 nm. Because the size of the part, exposed by the pixel defining pattern, of the end portion of the first defining structure is relatively small, at least part of the film layers of the light emitting functional layer can be disconnected, and at the same time, the second electrode shall not be disconnected as much as possible, thus improving the uniformity and image quality of the display substrate when it is used for display.

For example, the end portion 310 of the first defining structure 300 shown in FIG. 8 can have the same features as the end portion 310 in the display substrate shown in FIG. 2, and details will not be repeated here. For example, the sub-pixel 10 and the pixel defining pattern 400 in the display substrate shown in FIG. 8 can have the same features as the sub-pixel 10 and the pixel defining pattern 400 in the display substrate shown in FIG. 2, and details will not be repeated here.

For example, in the embodiments shown in FIGS. 1-8, the film layers between the light emitting element 100 and the base substrate 01 are illustratively omitted. For example, film layers, such as a planarization layer, a passivation layer, a pixel driving circuit (e.g., including a thin film transistor, a storage capacitor, etc.), various signal lines connected to the pixel driving circuit, and multiple insulating layers, etc., can be provided between the light emitting element 100 and the base substrate 01. For example, in the embodiments shown in FIGS. 1-8, film layers located at a side of the light emitting element 100 away from the base substrate 01, such as an encapsulation layer, a color filter layer, a filler, etc., are illustratively omitted.

The display substrate provided by the embodiment of the present disclosure is not limited by the backplane design and the materials of organic light emitting diode (OLED), and is compatible with all OLED screen designs.

Another embodiment of the present disclosure provides a display device, which can include the display substrate provided by any one of the examples shown in FIGS. 1-8. The display device provided by the embodiment of the present disclosure is provided with the first defining structure in the display substrate, which can effectively solve the lateral leakage problem between sub-pixels. In addition, by setting the thickness of the first defining structure on the first electrode, the features of the side surface of the end portion of the first defining structure, the size of the part of the first defining structure exposed by the pixel defining pattern, and the shape of the first defining structure, etc., at least one film layer included in the light emitting functional layer can be disconnected, and at the same time, the second electrode can still be a continuous electrode, thus improving the uniformity and display quality of the display device.

For example, the display device provided by the embodiment of the present disclosure further includes a cover plate located at the light exiting side of the display panel.

For example, the display device can be a display device, such as an organic light emitting diode display device, etc., or any product or component having display function and including the display device, such as a TV, a digital camera, a mobile phone (e.g., a mobile phone having an under-screen camera), a watch, a tablet computer, a notebook computer, a navigator, etc., without being limited in the present embodiment.

Another embodiment of the present disclosure provides a manufacturing method of a display substrate. The manufacturing method includes: forming a plurality of sub-pixels on a base substrate, wherein the forming the plurality of sub-pixels includes sequentially forming a first electrode, a light emitting functional layer and a second electrode which are arranged in a stacked manner in a direction perpendicular to the base substrate, and the light emitting functional layer includes a plurality of film layers; after forming the first electrode and before forming the light emitting functional layer, the manufacturing method further includes forming a first defining structure material layer on the first electrode, and patterning the first defining structure material layer to form a first defining structure, wherein the first defining structure includes an end portion located between the light emitting functional layer and the first electrode; wherein a portion of the light emitting functional layer is formed on the end portion of the first defining structure, and at least one of the plurality of film layers in at least one sub-pixel is disconnected at the end portion of the first defining structure. In the embodiment of the present disclosure, by forming the first defining structure between the light emitting functional layer and the first electrode of the light emitting element, the problem of lateral leakage between sub-pixels can be alleviated or solved without affecting other manufacturing processes of the display substrate and the display performance of the organic light emitting diode (OLED) display substrate, thereby improving the display quality of the display substrate when it is used for display.

FIGS. 9A-9D are process flow charts of a manufacturing method of a display substrate provided by an example of an embodiment of the present disclosure. The display substrate provided in the examples shown in FIGS. 2-7 can be formed by the manufacturing method shown in FIGS. 9A-9D.

As shown in FIGS. 2-7 and FIGS. 9A-9D, the manufacturing method of the display substrate includes: forming a plurality of sub-pixels 10 on a base substrate 01. The step of forming the plurality of sub-pixels 10 includes sequentially forming a first electrode 110, a light emitting functional layer 130 and a second electrode 120 which are arranged in a stacked manner in a direction perpendicular to the base substrate 01, and the light emitting functional layer 130 includes a plurality of film layers. The structure and arrangement manner of the sub-pixels 10 formed by the manufacturing method provided in the present example can have the same features as the structure and arrangement manner of the sub-pixels 10 shown in FIGS. 2-7, and details will not be repeated here.

As shown in FIGS. 2-7 and FIGS. 9A-9D, after forming the first electrode 110 and before forming the light emitting functional layer 130, the manufacturing method further includes forming a first defining structure material layer 3000 on the first electrode 110 and patterning the first defining structure material layer 3000 to form a first defining structure 300. The first defining structure 300 includes an end portion 310 located between the light emitting functional layer 130 and the first electrode 110. A portion of the light emitting functional layer 130 is formed on the end portion 310 of the first defining structure 300, and at least one of the plurality of film layers included in the light emitting functional layer 130 in at least one sub-pixel 10 is disconnected at the end portion 310 of the first defining structure 300. The first defining structure 300 and the end portion 310 thereof formed by the manufacturing method provided in the present example can have the same features as the first defining structure 300 and the end portion 310 thereof shown in FIGS. 2-7, and details will not be repeated here.

For example, as shown in FIGS. 2-7 and FIGS. 9A-9D, a step of forming the first defining structure material layer 3000 on the first electrode 110 and patterning the first defining structure material layer 3000 includes depositing the first defining structure material layer 3000 on the first electrode 110. For example, in the process of depositing the first defining structural material layer 3000, the deposition rate of the first defining structural material layer 3000 can be gradually slowed down by controlling parameters, such as power and pressure, etc., so that the density of the part of the first defining structural material layer 3000 away from the base substrate 01 is greater than the density of the part of the first defining structural material layer 3000 close to the base substrate 01.

For example, as shown in FIGS. 2-7 and FIGS. 9A-9D, the first defining structure material layer 3000 is etched. For example, the slower the deposition rate of the first defining structure material layer 3000, the denser the film quality of the first defining structure material layer 3000 (e.g., the farther away from the base substrate 01 the part of the first defining structure material layer 3000, the denser the film quality of the part of the first defining structure material layer 3000), and the slower the etching rate when the first defining structure material layer 3000 is etched. For example, the etching rate at the position with a relatively high density in the first defining structure material layer 3000 is relatively slow, so that the side surface of the end portion 310 being formed includes an inclined surface, and the end of the inclined surface away from the base substrate 01 is inclined to the center of the sub-pixel 10 in which the light emitting functional layer 130 is disconnected by the end portion 310.

For example, the inclination angle of the inclined surface of the end portion 310 can be the same as the inclination angle of the inclined surface of the end portion 310 in the examples shown in FIGS. 2-7, and details will not be repeated here.

For example, as shown in FIGS. 2-7 and FIGS. 9A-9D, the first defining structure material layer 3000 is patterned by using photoresist 500 as a mask to form the first defining structure 300. For example, the end portion 310 having the partition part 311 and the buffer part 312 shown in FIG. 3 can be formed by setting the shape of the photoresist 500. For example, the end portion 310 having the partition part

311 and the buffer part 312 shown in FIG. 3 can be formed by using a gray tone mask or a half tone mask (HTM).

Figure 10A:
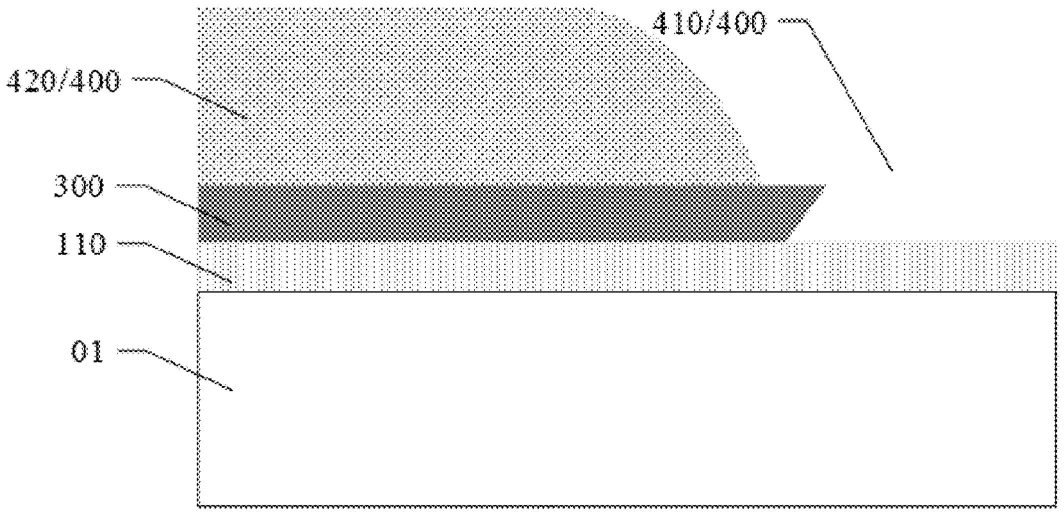
FIG. 10A is a schematic diagram of a position for forming a second defining structure not completely covering an end portion of a first defining structure as shown in FIGS. 2-6A.
Figure 10B:
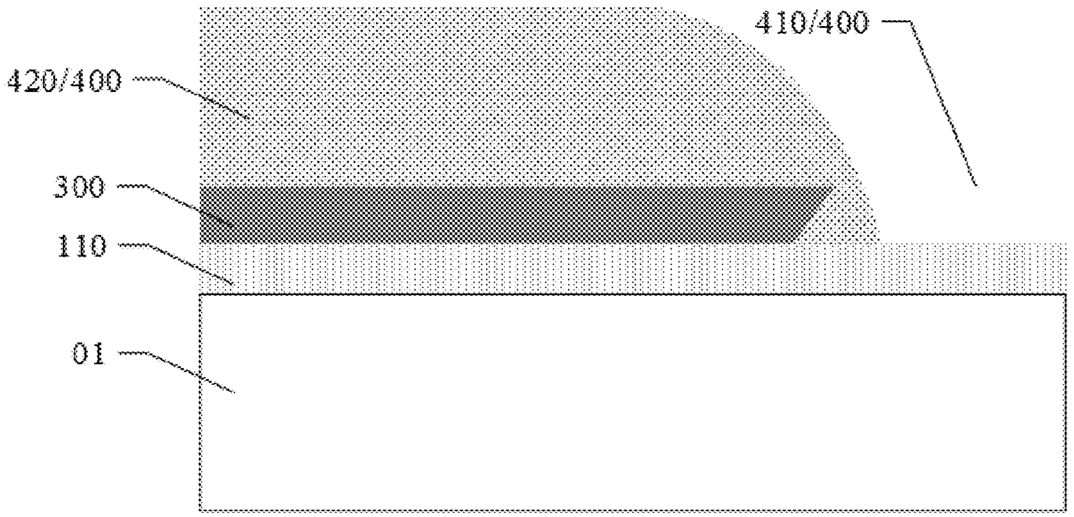
FIG. 10B is a schematic diagram of a position for forming a second defining structure completely covering an end portion of a first defining structure as shown in FIGS. 6A-7.

FIG. 10A is a schematic diagram of a position for forming a second defining structure 420 not completely covering the end portion 310 of a first defining structure 300 as shown in FIGS. 2-6A, and FIG. 10B is a schematic diagram of a position for forming a second defining structure 420 completely covering the end portion 310 of a first defining structure 300 as shown in FIGS. 6A-7. For example, as shown in FIGS. 2-10B, after forming the first defining structure 300 and before forming the light emitting functional layer 130, the manufacturing method further includes patterning to form a pixel defining pattern 400 on the first defining structure 300. For example, the pixel defining pattern 400 includes a plurality of openings 410, and one sub-pixel 10 corresponds to at least one opening 410. The pixel defining pattern 400 formed in the present example can have the same features as the pixel defining pattern 400 shown in FIGS. 2-7, and details will not be repeated here.

For example, after forming the pixel defining pattern 400, at least part of the film layers of the light emitting functional layer 130 is evaporated on the pixel defining pattern 400, and at least one film layer of the light emitting functional layer 130 formed on the end portion 310 of the first defining structure 300 exposed by the opening 410 is disconnected at the position of the end portion 310.

For example, after forming the light emitting functional layer 130, the second electrode 120 is formed on the light emitting functional layer 130. The second electrode 120 formed at the position corresponding to the end portion 310 can be a continuous film layer or a disconnected film layer. For example, the structure of the end portion of the first defining structure and the positional relationship between the end portion and the second defining structure can be set with reference to the above description, so that the second electrode formed at the position corresponding to the end portion is a continuous film layer, thus improving the uniformity and display quality when the display substrate being formed is used for display.

For example, the manufacturing method of the display substrate provided by the embodiment of the present disclosure omits the manufacturing method of forming structures between the first electrode of the light emitting element and the base substrate.

Figure 11A:
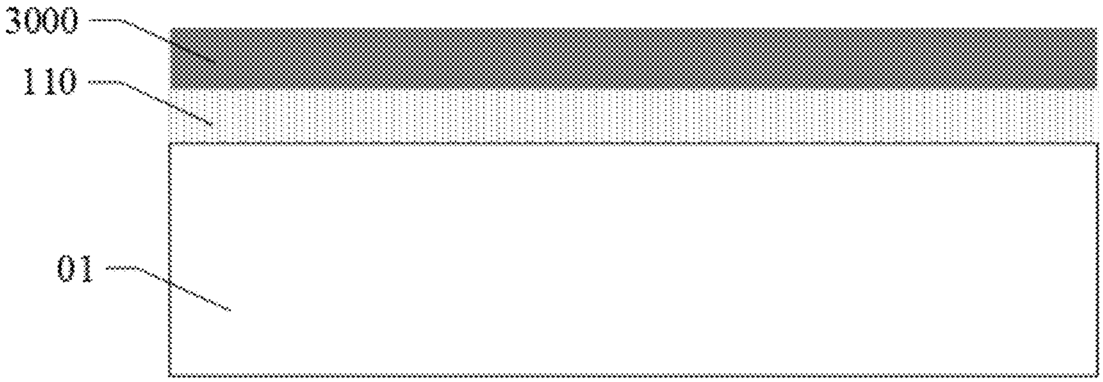
FIGS. 11A-11C are process flow charts of a manufacturing method of a display substrate provided by another example of the embodiment of the present disclosure.
Figure 11B:
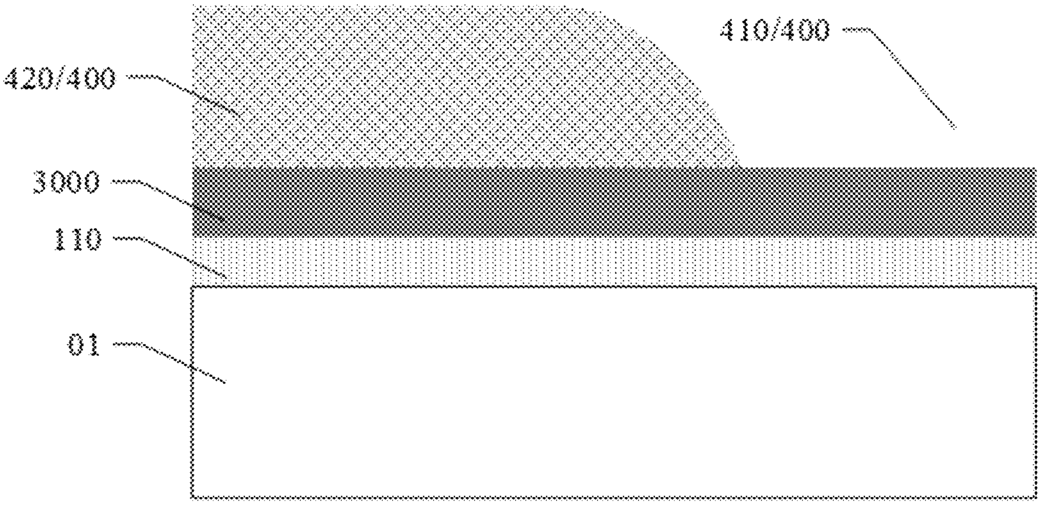
Figure 11C:
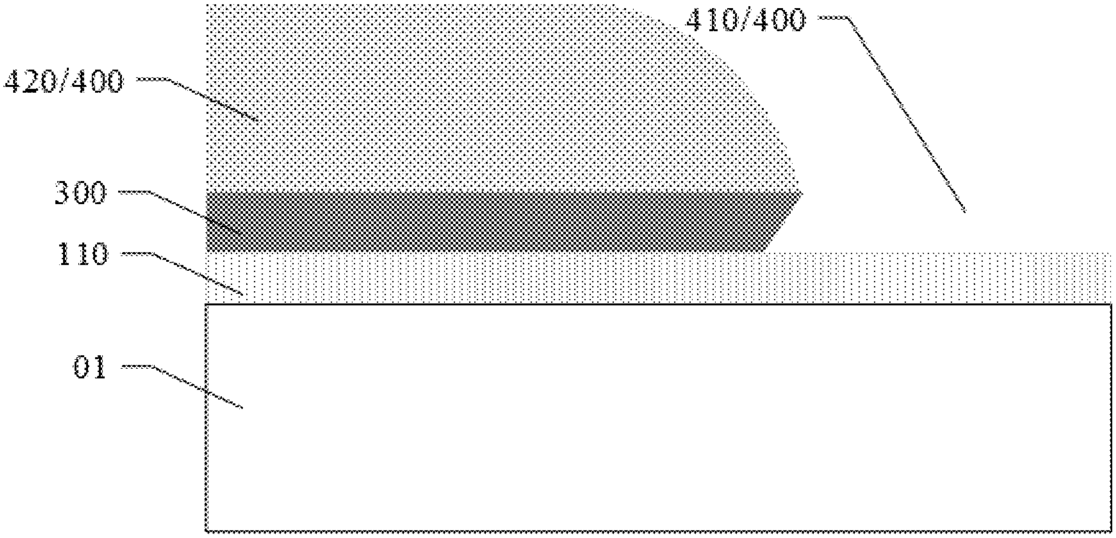

FIGS. 11A-11C are process flow charts of a manufacturing method of a display substrate provided by another example of the embodiment of the present disclosure. The display substrate provided in the example shown in FIG. 8 can be formed by the manufacturing method shown in FIGS. 11A-11C.

As shown in FIG. 8 and FIGS. 11A-11C, the manufacturing method of the display substrate includes: forming a plurality of sub-pixels 10 on a base substrate 01. The forming the plurality of sub-pixels 10 includes sequentially forming a first electrode 110, a light emitting functional layer 130 and a second electrode 120 which are arranged in a stacked manner in a direction perpendicular to the base substrate 01, and the light emitting functional layer 130 includes a plurality of film layers. The structure and arrangement manner of the sub-pixels 10 formed by the manufacturing method provided in the present example can have the same features as the structure and arrangement manner of the sub-pixels 10 shown in FIG. 8, and details will not be repeated here.

As shown in FIG. 8 and FIGS. 11A-11C, after forming the first electrode 110 and before forming the light emitting functional layer 130, the manufacturing method further includes forming a first defining structure material layer 3000 on the first electrode 110 and patterning the first defining structure material layer 3000 to form a first defining structure 300. The first defining structure 300 includes an end portion 310 located between the light emitting functional layer 130 and the first electrode 110. A portion of the light emitting functional layer 130 is formed on the end portion 310 of the first defining structure 300, and at least one of the plurality of film layers included in the light emitting functional layer 130 in at least one sub-pixel 10 is disconnected at the end portion 310 of the first defining structure 300. The first defining structure 300 and the end portion 310 thereof formed by the manufacturing method provided in the present example can have the same features as the first defining structure 300 and the end portion 310 thereof shown in FIG. 8, and details will not be repeated here.

For example, as shown in FIG. 8 and FIGS. 11A-11C, the step of the forming the first defining structure material layer 3000 on the first electrode 110 and patterning the first defining structure material layer 3000 includes depositing the first defining structure material layer 3000 on the first electrode 110. For example, in the process of depositing the first defining structural material layer 3000, the deposition rate of the first defining structural material layer 3000 can be gradually slowed down by controlling parameters, such as power and pressure, etc., so that the density of the part of the first defining structural material layer 3000 away from the base substrate 01 is greater than the density of the part of the first defining structural material layer 3000 close to the base substrate 01.

For example, as shown in FIG. 8 and FIGS. 11A-11C, the first defining structure material layer 3000 is etched. For example, the slower the deposition rate of the first defining structure material layer 3000, the denser the film quality of the first defining structure material layer 3000, and the slower the etching rate when the first defining structure material layer 3000 is etched. For example, the etching rate at the position with a relatively high density in the first defining structure material layer 3000 is relatively slow, so that the side surface of the end portion 310 being formed includes an inclined surface, and the end of the inclined surface away from the base substrate 01 is inclined to the center of the sub-pixel 10 in which the light emitting functional layer 130 is disconnected by the end portion 310.

For example, the inclination angle of the inclined surface of the end portion 310 can be the same as the inclination angle of the inclined surface of the end portion 310 in the examples shown in FIG. 8, and details will not be repeated here.

For example, as shown in FIG. 8 and FIGS. 11A-11C, before patterning the first defining structure material layer 3000, the manufacturing method further includes patterning to form a pixel defining pattern 400 on the first defining structure material layer 3000. For example, the pixel defining pattern 400 includes a plurality of openings 410, and one sub-pixel 10 corresponds to at least one opening 410.

For example, as shown in FIG. 8 and FIGS. 11A-11C, a step of patterning to form the first defining structure 300 includes patterning the first defining structure material layer 3000 by using the pixel defining pattern 400 as a mask. In the manufacturing method shown in FIGS. 11A-11C, the pixel defining pattern 400 is used as a mask to form the first defining structure 300, and no additional patterning process steps are added, so as to avoid productivity loss and save costs. In addition, it can also solve the problem of residual pixel defining material layer on the pixel surface during the manufacturing process of the pixel defining pattern, so as to avoid the life decay of organic light emitting diode (OLED) devices caused by the residual film layer.

For example, as shown in FIG. 8 and FIGS. 11A-11C, after forming the first defining structure material layer 3000, a pixel defining material layer is formed on the first defining structure material layer 3000, and the pixel defining material layer is patterned, for example, by curing, to form a pixel defining pattern 400; then, the first defining structure material layer 3000 is etched by using the pixel defining pattern 400 as a mask. At this time, the first electrode 110 has crystallized and become denser after high-temperature annealing, and the probability of damage to the first electrode 110 caused by etching the first defining structure material layer 3000 is low.

For example, in the process of etching the first defining structure material layer 3000 by using the pixel defining pattern 400 as a mask, the edge of the opening 410 of the pixel defining pattern 400 will be etched to a certain extent and shrunk by a small size relative to the edge of the end portion 310 of the first defining structure 300, so that the end portion 310 of the first defining structure 300 includes a part exposed by the opening 410.

In the first defining structure manufactured by the manufacturing method shown in FIGS. 11A-11C, at least one film layer of the light emitting functional layer of adjacent sub-pixels can be physically separated, and at the same time, the second electrode of the adjacent sub-pixels is not disconnected, thus not only solving the problem of lateral leakage between adjacent pixels, but also preventing the occurrence of pixel failure caused by the breakage of the second electrode.

For example, after forming the pixel defining pattern 400, at least part of the film layers of the light emitting functional layer 130 is evaporated on the pixel defining pattern 400, and at least one film layer of the light emitting functional layer 130 formed on the end portion 310 of the first defining structure 300 exposed by the opening 410 is disconnected at the position of the end portion 310.

For example, after forming the light emitting functional layer 130, the second electrode 120 is formed on the light emitting functional layer 130. The second electrode 120 formed at the position corresponding to the end portion 310 is a continuous film layer, thus contributing to improving the uniformity and display quality when the display substrate being formed is used for display.

For example, the display device can be a large-sized transparent display device.

The following statements should be noted:

(1) In the accompanying drawings of the embodiments of the present disclosure, the drawings involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, the protection scope of the present disclosure is not limited thereto, and the protection scope of the present disclosure should be based on the protection scope of the claims.

The invention claimed is:

1. A display substrate, comprising a display region, wherein the display substrate comprises a base substrate and a plurality of sub-pixels located on the base substrate, at least part of the sub-pixels located in the display region comprise a light emitting element, the light emitting element comprises a light emitting functional layer, and a first electrode and a second electrode which are located at both sides of the light emitting functional layer along a direction perpendicular to the base substrate, the first electrode is located between the light emitting functional layer and the base substrate, and the light emitting functional layer comprises a plurality of film layers;

wherein the display substrate further comprises at least one first defining structure located between at least two adjacent sub-pixels, the at least one first defining structure comprises an end portion located between the light emitting functional layer and the first electrode, and the first electrode overlaps with the end portion in the direction perpendicular to the base substrate;

at least one of the plurality of film layers in at least one sub-pixel is disconnected at the end portion of the first defining structure, the display substrate further comprising:

a pixel defining pattern, located at a side of the first electrode away from the base substrate, the pixel defining pattern comprising a plurality of openings, one sub-pixel corresponding to at least one opening, at least part of the light emitting element of the sub-pixel being located in the opening corresponding to the sub-pixel, and at least part of the first electrode overlapping with the opening, wherein the pixel defining pattern comprises a second defining structure surrounding the opening, and the second defining structure covers at least part of the first defining structure, the opening corresponding to the at least one sub-pixel exposes at least part of the end portion of the first defining structure, so that at least one of the plurality of film layers is disconnected at the end portion, a side surface of the end portion comprises an inclined surface, the first defining structure comprises a first surface connected with the inclined surface, the inclined surface is located between the first surface and the first electrode, the first surface is in contact with the second defining structure, and the at least one of the plurality of film layers is disconnected at a junction between the first surface and the inclined surface.

2. The display substrate according to claim 1, wherein an orthographic projection of the second defining structure on the base substrate completely falls within an orthographic projection of the first defining structure on the base substrate.

3. The display substrate according to claim 1, wherein the end portion comprises a partition part and a buffer part, and the buffer part is located at a side of the partition part close to the base substrate, and wherein the buffer part protrudes relative to an edge of the partition part and extends to a center of the sub-pixel in which the light emitting functional layer is disconnected by the end portion.

4. The display substrate according to claim 1, wherein, in the at least one sub-pixel, the second electrode is a continuous film layer at the end portion.

5. The display substrate according to claim 1, wherein an included angle between a surface of the first defining structure, in contact with the first electrode, and the inclined surface is not less than 90 degrees.

6. The display substrate according to claim 1, wherein the plurality of film layers comprises a light emitting layer and at least one common layer, and the at least one common layer is a film layer shared by at least two sub-pixels, and wherein the at least one common layer is disconnected at the end portion.

7. The display substrate according to claim 6, wherein only some of the plurality of film layers are disconnected at the end portion.

8. The display substrate according to claim 1, wherein the first defining structure surrounds and covers at least part of one circle of an edge of the first electrode in the at least one sub-pixel.

9. The display substrate according to claim 1, wherein the at least one of the plurality of film layers in the light emitting functional layer of the at least one sub-pixel is a continuous film layer at a partial position at an edge of the opening corresponding to the at least one sub-pixel.

10. The display substrate according to claim 9, wherein the first defining structure comprises a ring-shaped first defining structure surrounding the first electrode of the at least one sub-pixel, and the opening corresponding to the at least one sub-pixel only exposes a part of the ring-shaped first defining structure, so that the plurality of film layers are continuous film layers at a position of the ring-shaped first defining structure not exposed by the opening.

11. The display substrate according to claim 9, wherein each sub-pixel comprises a light emitting region, the plurality of sub-pixels are arrayed along a first direction and a second direction, a distance between adjacent edges of light emitting regions of two adjacent sub-pixels arranged along the first direction is a first distance, a distance between adjacent edges of light emitting regions of two adjacent sub-pixels arranged along the second direction is a second distance, the first direction is intersected with the second direction, a distance between adjacent edges of light emitting regions of two adjacent sub-pixels arranged along a third direction intersected with both the first direction and the second direction is a third distance, and both the first distance and the second distance are less than the third distance; and the at least one of the plurality of film layers in the light emitting functional layer of at least one of the two adjacent sub-pixels arranged along the third direction is a continuous film layer at edge positions of light emitting regions of the adjacent two sub-pixels.

12. The display substrate according to claim 3, wherein, in a direction perpendicular to the base substrate, a thickness of the partition part is greater than a thickness of the buffer part, and wherein a size of the buffer part between two adjacent sub-pixels along a direction parallel to a central connecting line of the two adjacent sub-pixels is not greater than 300 nm.

13. The display substrate according to claim 1, wherein a material of the first defining structure comprises an inorganic nonmetallic material.

14. The display substrate according to claim 1, wherein the first electrode comprises a plurality of electrode layers, and at least an electrode layer closest to the light emitting functional layer in the plurality of electrode layers comprises a crystalline structure.

15. A display device, comprising the display substrate according to claim 1.

16. A manufacturing method of a display substrate, comprising:

forming a plurality of sub-pixels on a base substrate, wherein the forming the plurality of sub-pixels comprises sequentially forming a first electrode, a light emitting functional layer, and a second electrode which are arranged in a stacked manner in a direction perpendicular to the base substrate, and the light emitting functional layer comprises a plurality of film layers; and after forming the first electrode and before forming the light emitting functional layer, the manufacturing method further comprising forming a first defining structure material layer on the first electrode and patterning the first defining structure material layer to form a first defining structure, wherein the first defining structure comprises an end portion located between the light emitting functional layer and the first electrode, wherein a portion of the light emitting functional layer is formed on the end portion of the first defining structure, and at least one of the plurality of film layers in at least one sub-pixel is disconnected at the end portion of the first defining structure, the forming the first defining structure material layer on the first electrode and patterning the first defining structure material layer comprises:

depositing the first defining structure material layer on the first electrode, wherein, in a process of depositing the first defining structure material layer, a deposition rate gradually slows down so that a density of a part of the first defining structure material layer away from the base substrate is higher than a density of a part of the first defining structure material layer closer to the base substrate; and etching the first defining structure material layer, wherein an etching rate at a position with a higher density in the first defining structure material layer is slower, so that a side surface of the end portion being formed comprises an inclined surface, and an end of the inclined surface away from the base substrate is inclined to a center of the at least one sub-pixel.

17. The manufacturing method according to claim 16, wherein the patterning the first defining structure material layer comprises patterning the first defining structure material layer with a pixel defining pattern as a mask.

* * * * *